(12) United States Patent
Jeong et al.

(10) Patent No.: US 10,861,920 B2
(45) Date of Patent: Dec. 8, 2020

(54) THIN FILM TRANSISTOR SUBSTRATE, METHOD OF MANUFACTURING THE SAME, AND DISPLAY DEVICE INCLUDING THE SAME

(71) Applicant: SAMSUNG DISPLAY CO., LTD., Yongin-si (KR)

(72) Inventors: Woo Ho Jeong, Anyang-si (KR); Seokje Seong, Seongnam-si (KR); Semyung Kwon, Yongin-si (KR); Yoon Ho Kim, Asan-si (KR); Byungju Lee, Gunpo-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/412,059

(22) Filed: May 14, 2019

(65) Prior Publication Data
US 2019/0355799 A1 Nov. 21, 2019

(30) Foreign Application Priority Data
May 18, 2018 (KR) ........................ 10-2018-0057447

(51) Int. Cl.
*H01L 27/32* (2006.01)
*H01L 51/00* (2006.01)
(Continued)

(52) U.S. Cl.
CPC ...... *H01L 27/3262* (2013.01); *H01L 27/3258* (2013.01); *H01L 27/3265* (2013.01); *H01L 27/3276* (2013.01); *H01L 51/0097* (2013.01); *H01L 27/124* (2013.01); *H01L 27/1225* (2013.01); *H01L 27/1251* (2013.01);
(Continued)

(58) Field of Classification Search
None
See application file for complete search history.

(56) References Cited

U.S. PATENT DOCUMENTS 9,698,279 B2 7/2017 Kim
2011/0128211 A1* 6/2011 Ono ..................... H01L 27/3265
345/76
(Continued)

FOREIGN PATENT DOCUMENTS

JP 2017-162852 9/2017
JP 6216420 10/2017

*Primary Examiner* — Nishath Yasmeen
(74) *Attorney, Agent, or Firm* — F. Chau & Associates, LLC

(57) ABSTRACT

A TFT substrate includes a first active pattern, a first gate insulation, and a first gate. A second gate is on a second gate insulation covering the first gate. A source connection electrode contacts a source region of the first active pattern. A drain connection electrode contacts its drain region. A second active pattern is on a first insulation covering the second gate. A third gate insulation covers the second active pattern. A third gate is disposed on the third gate insulation. A second insulation interlayer covers the third gate. A first source, a first drain, a second source, and a second drain are disposed on the second insulation interlayer. The first source and the first drain contact the source connection electrode and the drain connection electrode. The second source and the second drain contact a source region and a drain region of the second active pattern.

15 Claims, 20 Drawing Sheets

(51) Int. Cl.
  *H01L 29/66* (2006.01)
  *H01L 27/12* (2006.01)
  *H01L 29/786* (2006.01)
(52) U.S. Cl.
  CPC ...... *H01L 27/1255* (2013.01); *H01L 27/1259* (2013.01); *H01L 29/66757* (2013.01); *H01L 29/66969* (2013.01); *H01L 29/7869* (2013.01); *H01L 29/78675* (2013.01); *H01L 2227/323* (2013.01); *H01L 2251/5338* (2013.01)

(56) References Cited

U.S. PATENT DOCUMENTS

| | | | | |
|---|---|---|---|---|
| 2014/0097455 A1* | 4/2014 | Ono | | H01L 27/124 257/91 |
| 2015/0048320 A1* | 2/2015 | Lee | | H01L 27/1255 257/40 |
| 2015/0055051 A1* | 2/2015 | Osawa | | H01L 27/1251 349/48 |
| 2015/0123084 A1* | 5/2015 | Kim | | H01L 27/1251 257/40 |
| 2016/0035805 A1* | 2/2016 | Kim | | H01L 27/3276 345/76 |
| 2016/0064465 A1* | 3/2016 | Oh | | H01L 29/7869 257/43 |
| 2016/0093647 A1* | 3/2016 | Kim | | H01L 27/3248 349/46 |
| 2016/0181339 A1* | 6/2016 | Lee | | H01L 27/1248 257/40 |
| 2016/0372497 A1* | 12/2016 | Lee | | G02F 1/136213 |
| 2017/0141169 A1* | 5/2017 | Sim | | H01L 27/3258 |
| 2017/0256569 A1* | 9/2017 | Ohara | | H01L 27/1251 |
| 2017/0278901 A1* | 9/2017 | Kim | | H01L 51/0097 |
| 2017/0309651 A1* | 10/2017 | Kim | | G02F 1/13458 |
| 2017/0317159 A1* | 11/2017 | Kim | | H01L 27/1222 |
| 2017/0373028 A1* | 12/2017 | Ryu | | G09G 3/2092 |

* cited by examiner

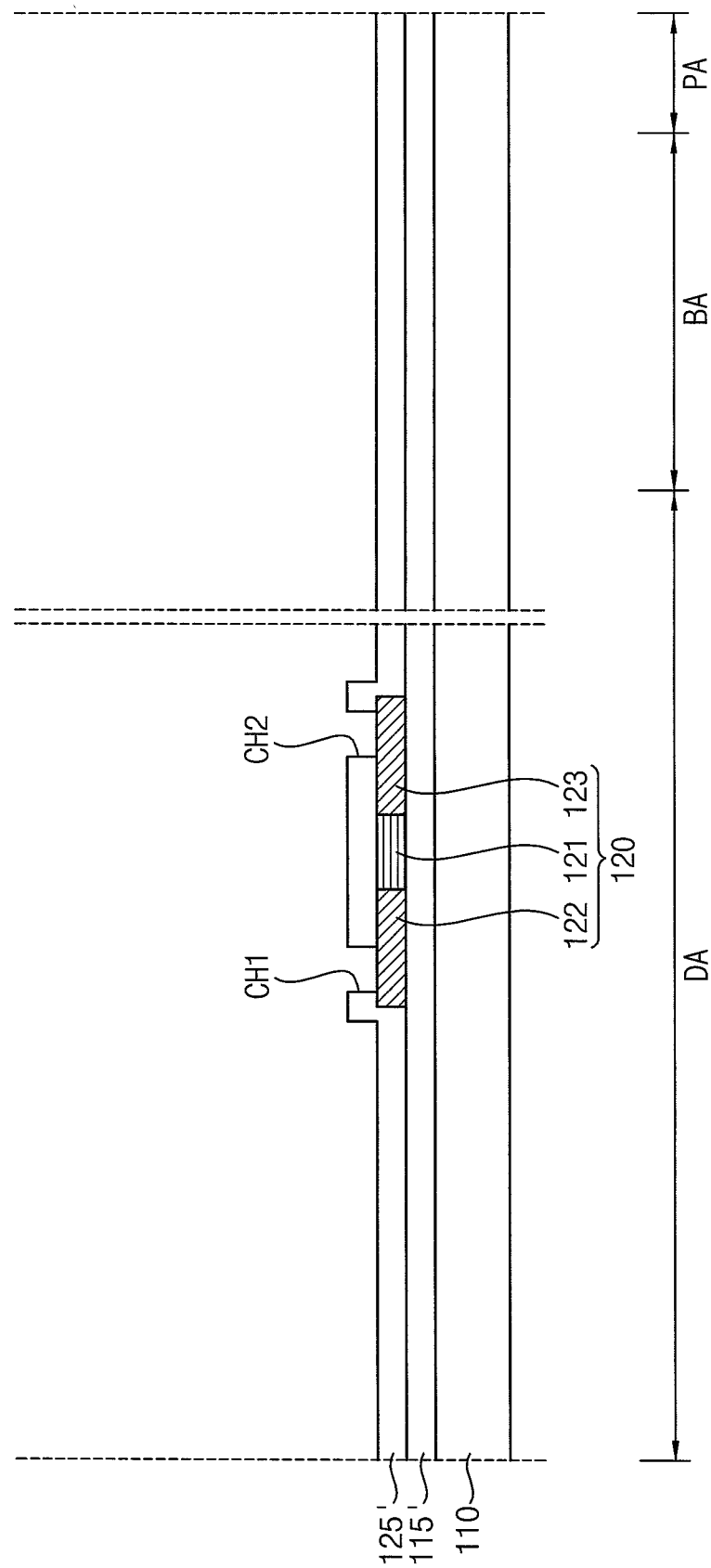

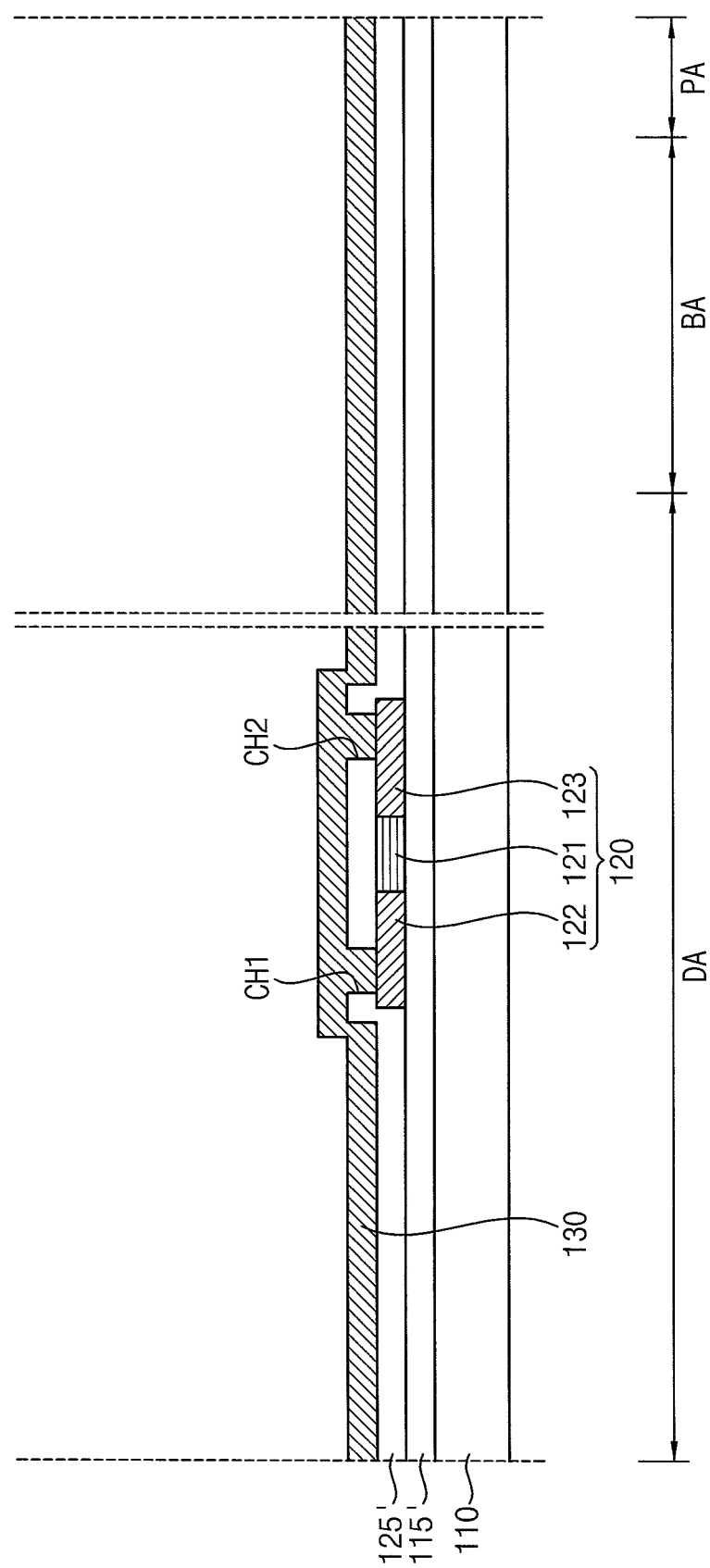

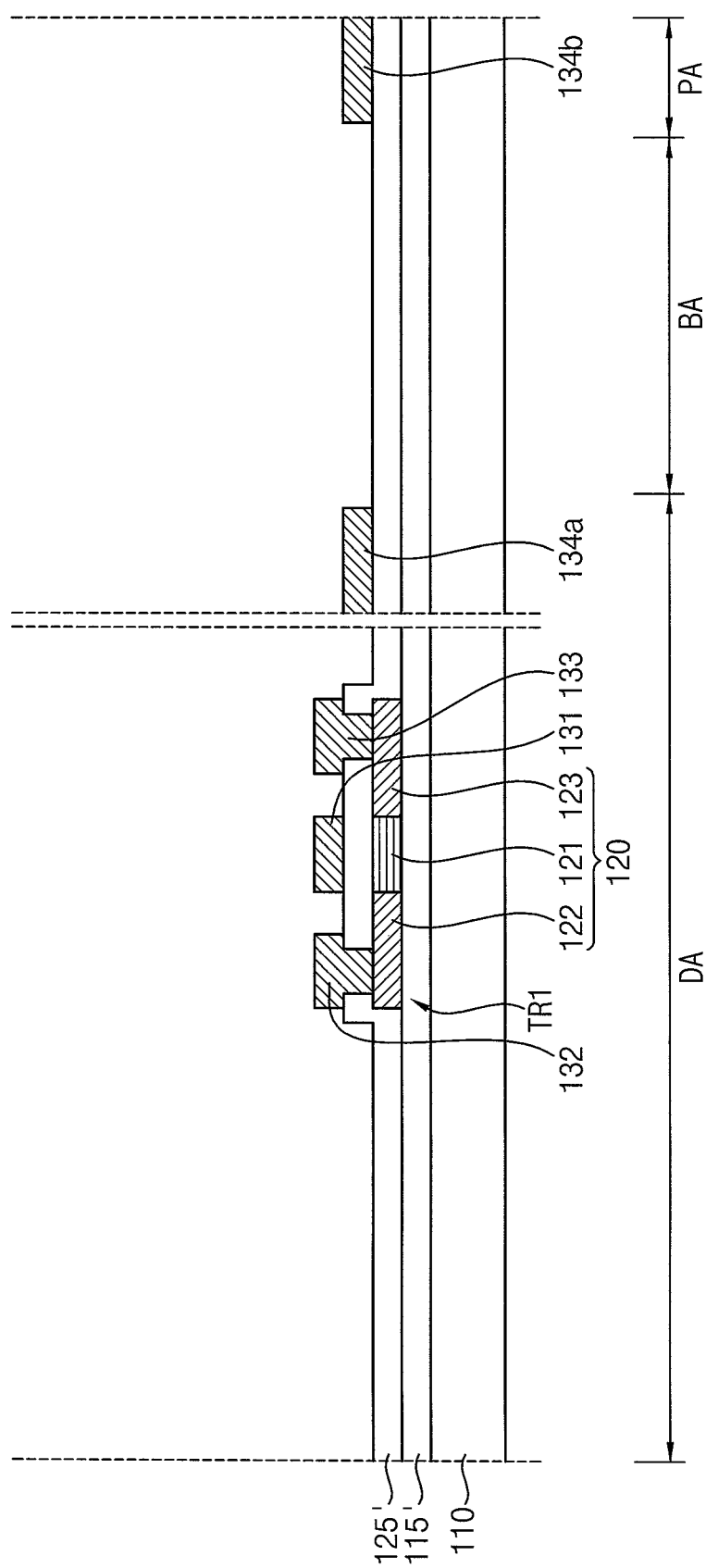

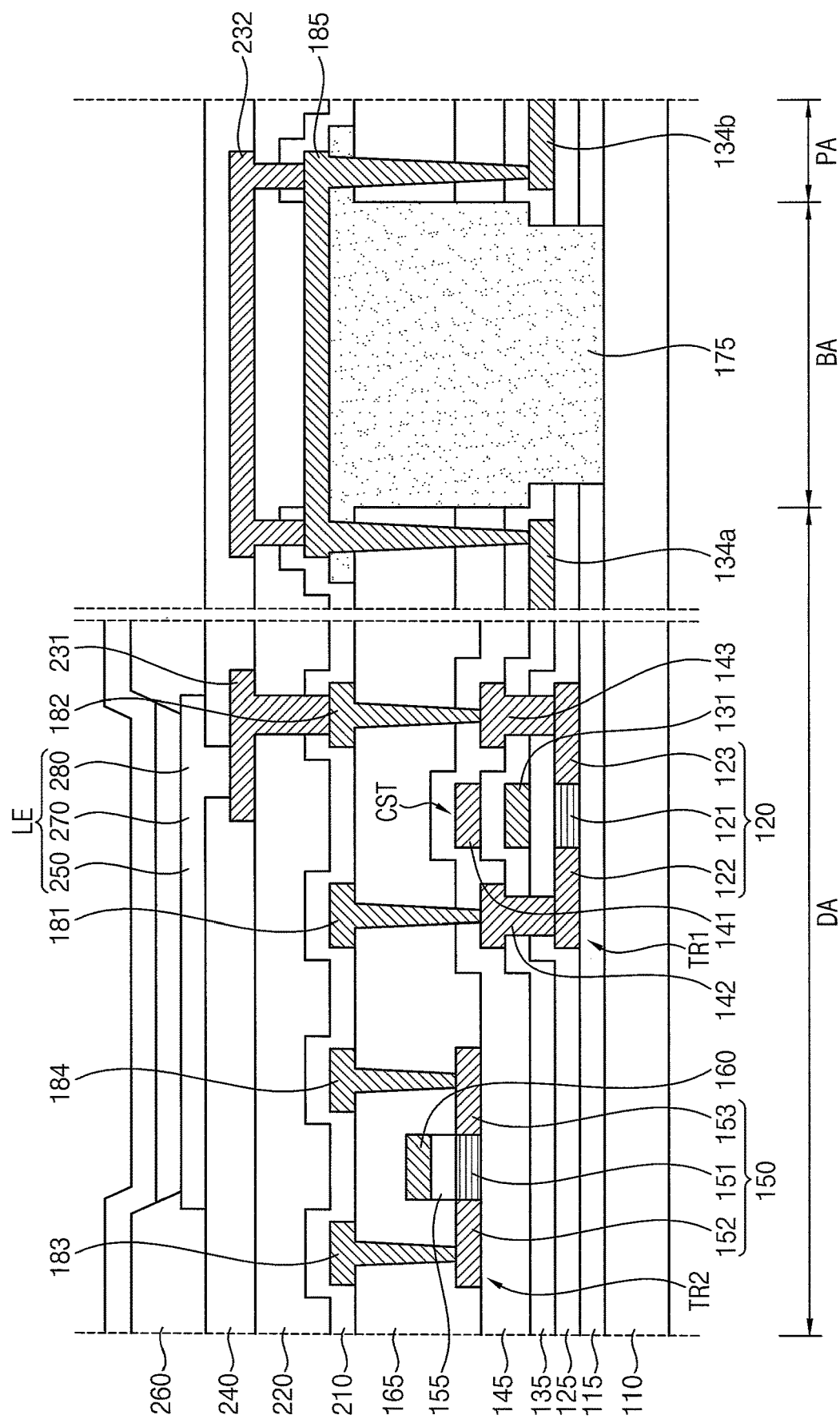

THIN FILM TRANSISTOR SUBSTRATE, METHOD OF MANUFACTURING THE SAME, AND DISPLAY DEVICE INCLUDING THE SAME

CROSS-REFERENCE TO RELATED APPLICATION(S)

This application claims priority under 35 USC § 119 to Korean Patent Application No. 10-2018-0057447, filed on May 18, 2018 in the Korean Intellectual Property Office (KIPO), the entire disclosure of which is herein incorporated by reference.

TECHNICAL FIELD

The present disclosure relates to a display device and, more particularly, to a thin film transistor substrate, a method of manufacturing a thin film transistor substrate, and a display device including a thin film transistor substrate.

DISCUSSION OF THE RELATED ART

Flat panel display devices are broadly used. Among the flat panel display devices, an organic light emitting display (OLED) device has attracted attention for being slim, light weight, low power, having a fast response speed, and for having other desirable properties. The OLED device may be characterized as a passive matrix OLED device or an active matrix OLED device, according to a driving manner. The active matrix OLED device may include a thin-film transistor substrate including a plurality of thin film transistors.

Generally, the thin film transistor may include a semiconductor layer. The semiconductor layer may be formed of amorphous semiconductor, polycrystalline semiconductor, oxide semiconductor, or the like. An electron mobility of the semiconductor layer may be relatively low when the semiconductor layer is formed of amorphous semiconductor, which is inappropriate for a display device driven in a high speed. Therefore, recent developments have the semiconductor layer formed of polycrystalline semiconductor or oxide semiconductor.

However, when the semiconductor layer is formed of polycrystalline semiconductor, an electron mobility of the polycrystalline semiconductor is relatively high but a threshold voltage of the polycrystalline semiconductor is not uniform due to polycrystalline nature thereof. Thus, a compensation circuit for compensating for the threshold voltage may be necessary. Moreover, when the semiconductor layer is formed of oxide semiconductor, a threshold voltage of the oxide semiconductor is relatively low but an electron mobility of the oxide semiconductor is lower than that of the polycrystalline semiconductor.

SUMMARY

A thin film transistor (TFT) substrate includes a base substrate. A first active pattern is disposed on the base substrate. A first gate insulation layer at least partially covers the first active pattern. A first gate electrode is disposed on the first gate insulation layer. The first gate electrode forms a first thin film transistor with the first active pattern. A second gate insulation layer at least partially covers the first gate electrode. A second gate electrode is disposed on the second gate insulation layer. The second gate electrode at least partially overlaps the first gate electrode. A source connection electrode contacts a source region of the first active pattern. A drain connection electrode contacts a drain region of the first active pattern. A first insulation interlayer at least partially covers the second gate electrode. A second active pattern is disposed on the first insulation layer. A third gate insulation layer at least partially covers the second active pattern. A third gate electrode is disposed on the third gate insulation layer. The third gate electrode forms a second thin film transistor with the second active pattern. A second insulation interlayer at least partially covers the third gate electrode. A first source electrode, a first drain electrode, a second source electrode, and a second drain electrode are each disposed on the second insulation interlayer. The first source electrode and the first drain electrode contact the source connection electrode and the drain connection electrode, respectively. The second source electrode and the second drain electrode contact a source region and a drain region of the second active pattern, respectively.

A method of manufacturing a thin film transistor substrate includes forming a first active pattern on a base substrate. A first gate insulation layer at least partially covers the first active pattern. A first gate electrode is formed on the first gate insulation layer. The first gate electrode forms a first thin film transistor with the first active pattern. A second gate insulation layer is formed to at least partially cover the first gate electrode. A second gate electrode is formed on the second gate insulation layer. The second gate electrode at least partially overlaps the first gate electrode. A source connection electrode is formed in contact with a source region of the first active pattern. A drain connection electrode is formed in contact with a drain region of the first active pattern. A first insulation interlayer is formed at least partially covering the second gate electrode. A second active pattern is formed on the first insulation layer. A third gate insulation layer is formed at least partially covering the second active pattern. A third gate electrode is formed on the third gate insulation layer. The third gate electrode forms a second thin film transistor with the second active pattern. A second insulation interlayer is formed at least partially covering the third gate electrode. Each of a first source electrode, a first drain electrode, a second source electrode, and a second drain electrode are formed on the second insulation interlayer. The first source electrode and the first drain electrode contact the source connection electrode and the drain connection electrode, respectively. The second source electrode and the second drain electrode contact a source region and a drain region of the second active pattern, respectively.

A display device includes a base substrate. A first active pattern is disposed on the base substrate. A first gate insulation layer at least partially covers the first active pattern. A first gate electrode is disposed on the first gate insulation layer. The first gate electrode forms a first thin film transistor with the first active pattern. A second gate insulation layer at least partially covers the first gate electrode. A second gate electrode is disposed on the second gate insulation layer. The second gate electrode at least partially overlaps the first gate electrode. A source connection electrode contacts a source region of the first active pattern. A drain connection electrode contacts a drain region of the first active pattern. A first insulation interlayer at least partially covers the second gate electrode. A second active pattern is disposed on the first insulation layer. A third gate insulation layer at least partially covers the second active pattern. A third gate electrode is disposed on the third gate insulation layer. The third gate electrode forms a second thin film transistor with the second active pattern. A second insulation interlayer at least partially covers the third gate electrode. A first source-drain pattern is disposed on the second insulation interlayer. The first source-drain pattern includes a first source electrode and a first drain electrode contacting the source connection electrode and the drain connection electrode, respectively. A second source electrode and a second drain electrode contact a source region and a drain region of the second active pattern, respectively. A first planarization layer at least partially covers the first source-drain pattern. A light emitting structure is disposed on the first planarization layer. The light emitting structure is electrically connected to the first thin film transistor.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIGS. 17 to 19 are cross-sectional views illustrating a method of manufacturing the thin film transistor substrate in FIG. 16; and FIG. 20 is a cross-sectional view illustrating a display device according to an exemplary embodiment of the present disclosure.

DETAILED DESCRIPTION OF THE EMBODIMENTS

Hereinafter, thin film transistor substrates, methods of manufacturing thin film transistor substrates, and display devices including thin film transistor substrates, in accordance with exemplary embodiments of the present invention, will be explained in detail with reference to the accompanying drawings.

Hereinafter, a display device, according to an exemplary embodiment of the present disclosure, will be described with reference to FIGS. 1 to 3.

Figure 1:
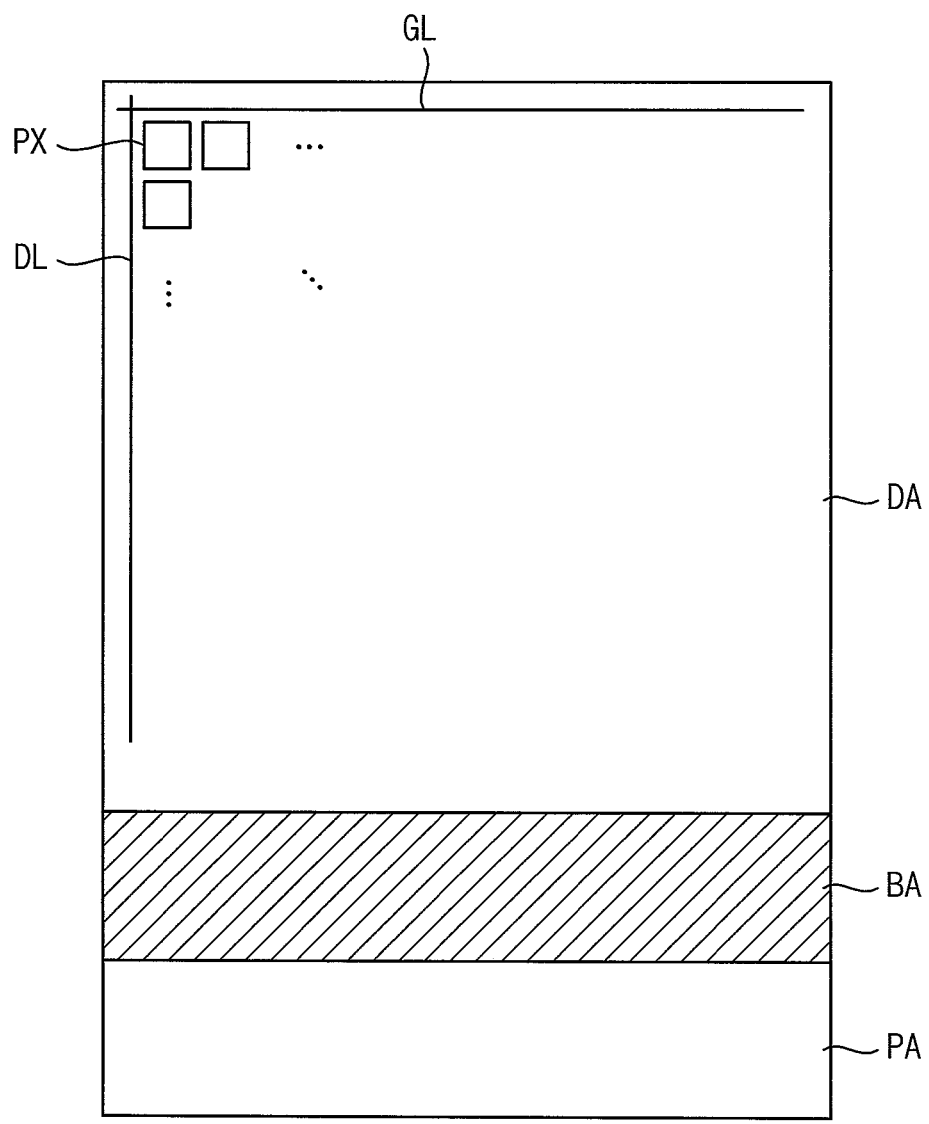
FIG. 1 is a plan view illustrating a display device according to an exemplary embodiment of the present disclosure.

FIG. 1 is a plan view illustrating a display device according to an exemplary embodiment of the present disclosure. FIG. 2 is a perspective view illustrating a bent shape of the display device in FIG. 1.

Figure 2:
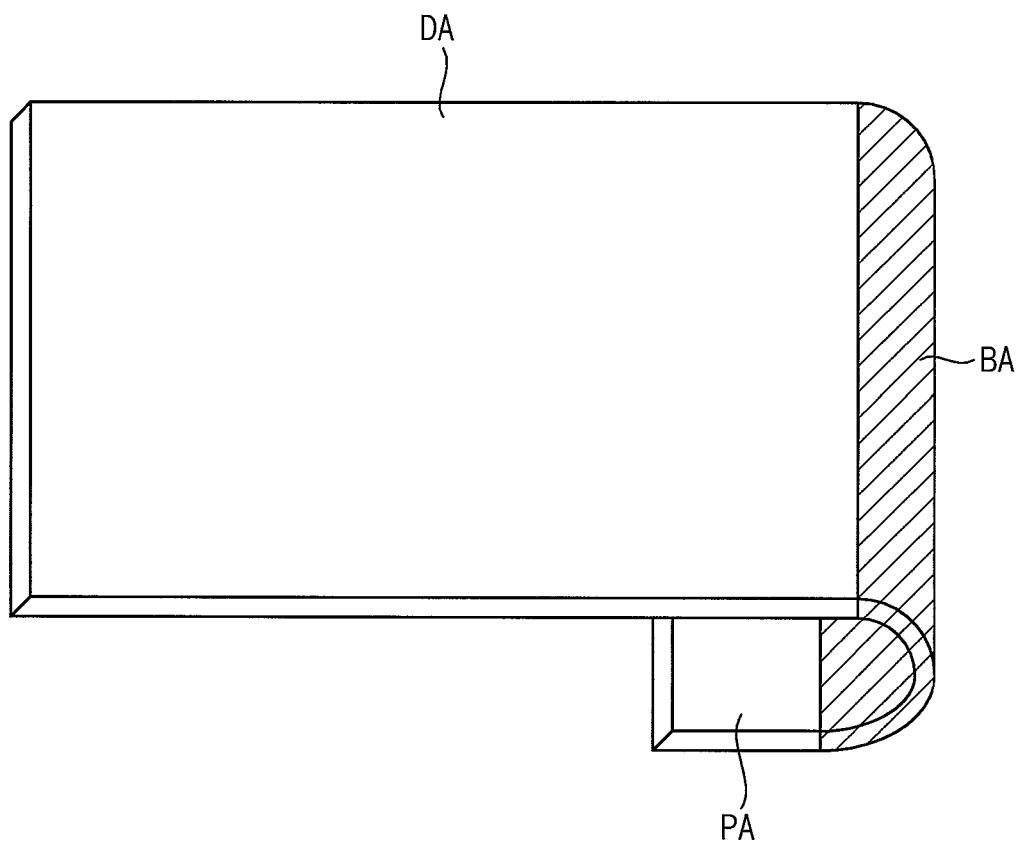
FIG. 2 is a perspective view illustrating a bent shape of the display device in FIG. 1.

Referring to FIGS. 1 and 2, a display device, according to an exemplary embodiment of the present disclosure, may include a first area DA, representing a display area upon which an image is displayed, a second area PA, representing a peripheral area, and a bending area BA disposed therebetween. A plurality of gate lines GL, a plurality of data lines DL crossing the gate lines GL, and a plurality of pixels PX formed at intersections between the gate lines GL and the data lines DL may be disposed in the first area DA. The first area DA may display an image formed by light emitted from the pixels PX. For example, the pixels PX may be arranged as a matrix form exclusively within the first area DA.

The pixels PX may include a light emitting element having an organic light emitting layer. However, the present invention is not limited thereto. The pixels PX may include various elements for displaying an image such as a liquid crystal element, an electrophoretic element, an electrowetting element, etc.

The second area PA may be spaced apart from the first area DA by the bending area BA. A plurality of pads electrically connected to an external device may be disposed in the second area PA. For example, the second area PA may be a pad area.

The bending area BA may be disposed between the first area DA and the second area PA. A plurality of wirings electrically connecting the pixels PX disposed in the first area DA and the pads disposed in the second area PA may be disposed within the bending area BA. The bending area BA may be bent.

As illustrated in FIG. 2, when the bending area BA is bent about a bending axis, the first area DA and the second area PA may be arranged opposite to each other. For example, the first area DA may be arranged on a front side of the display device, and the second area PA may be arranged on a rear side of the display device. By the bending of the bending area BA, the non-display area (e.g., dead space) of the display device may be perceived to have decreased.

Figure 3:
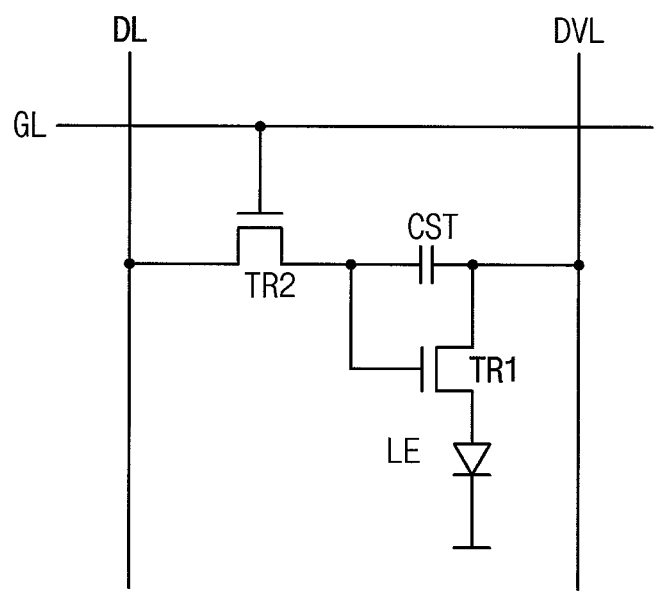
FIG. 3 is a circuit diagram illustrating a pixel of the display device in FIG. 1.

FIG. 3 is a circuit diagram illustrating the pixel PX of the display device in FIG. 1.

Referring to FIG. 3, the pixel PX may include thin film transistors TR1 and TR2 connected to a gate line GL, a data line DL, a driving voltage line DVL, etc., a capacitor CST, and a light emitting element LE.

The thin film transistor TR1 may be a driving thin film transistor TR1 for controlling the light emitting element LE. The thin film transistor TR2 may be a switching thin film transistor TR2 for controlling the driving thin film transistor TR1. Each pixel may include two thin film transistors TR1 and TR2, however, the present invention is not limited thereto. Each pixel may alternatively include three or more thin film transistors and one capacitor, each pixel may alternatively include one thin film transistor and one capacitor, or each pixel may alternatively include three or more thin film transistors and two or more capacitors. For example, each pixel may include seven thin film transistors, a capacitor, and a light emitting element.

The switching thin film transistor TR2 may include a gate electrode, a source electrode, and a drain electrode. In the switching thin film transistor TR2, the gate electrode may be connected to the gate line GL, and the source electrode may be connected to the data line DL. The drain electrode may be connected to the driving thin film transistor TR1. The switching thin film transistor TR2 may transmit a data signal applied to the data line DL according to a gate signal applied to the gate line GL.

The driving thin film transistor TR1 may include a gate electrode, a source electrode, and a drain electrode. In the driving thin film transistor TR1, the gate electrode may be connected to the switching thin film transistor TR2, and the source electrode may be connected to the driving voltage line DVL. The drain electrode may be connected to the light emitting element LE.

The light emitting element LE may include an organic light emitting layer, and a first electrode and a second electrode opposite to each other with the organic light emitting layer disposed therebetween. The first electrode may be connected to the drain electrode of the driving thin film transistor TR1. The second electrode may be connected to a common voltage line, and a common voltage may be applied to the second electrode. The organic light emitting layer may emit light according to an output signal of the driving thin film transistor TR1 thereby displaying an image. Here, the color of light emitted from the organic light emitting layer may vary according to materials of the organic light emitting layer, and the light may be single-colored light or white light.

The capacitor CST may be connected between the gate electrode and the source electrode of the driving thin film transistor TR1, and may charge and maintain the data signal inputted to the gate electrode of the driving thin film transistor TR1.

Hereinafter, a cross-sectional structure of a thin film transistor substrate of the display device according to an exemplary embodiment of the present disclosure will be described with reference to FIG. 4.

Figure 4:
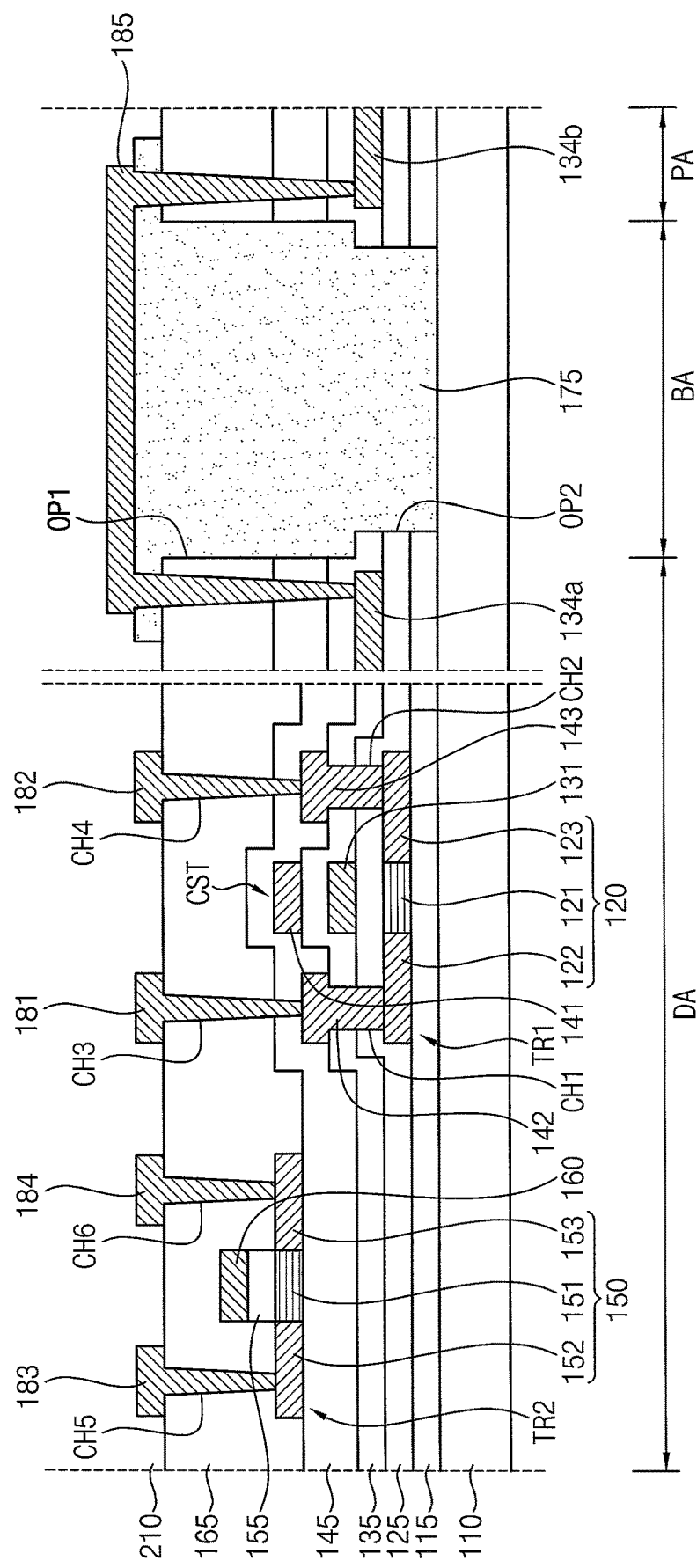
FIG. 4 is a cross-sectional view illustrating a thin film transistor substrate according to an exemplary embodiment of the present disclosure.

FIG. 4 is a cross-sectional view illustrating a thin film transistor substrate according to an exemplary embodiment of the present disclosure. The thin film transistor substrate illustrated in FIG. 4 may include the driving thin film transistor TR1, the switching thin film transistor TR2, and the capacitor CST of the display device.

Referring to FIG. 4, the thin film transistor substrate, according to an exemplary embodiment of the present disclosure, may include a first active pattern 120, a first gate insulation layer 125, a first gate electrode 131, a second gate insulation layer 135, a second gate electrode 141, a source connection electrode 142, a drain connection electrode 143, a first insulation interlayer 145, a second active pattern 150, a third gate insulation layer 155, a third gate electrode 160, a second insulation interlayer 165, a first source electrode 181, a first drain electrode 182, a second source electrode 183, and a second drain electrode 184 provided on a base substrate 110. The first area DA, the second area PA, and the bending area BA of the display device may be defined in the thin film transistor substrate.

A buffer layer 115 may be disposed on the base substrate 110. The base substrate 110 may include a transparent insulating substrate. For example, the base substrate 110 may include a glass substrate, a quartz substrate, a transparent plastic substrate, a transparent metal oxide substrate, etc. The buffer layer 115 may prevent permeation of impurities, such as oxygen, moisture, etc., from the base substrate 110, and may planarize the base substrate 110. Further, the buffer layer 115 may control a heat transmission rate in an annealing process for the formation of the first active pattern 120. The buffer layer 115 may include silicon oxide, silicon nitride, silicon oxynitride, etc.

The first active pattern 120 may be disposed on the buffer layer 115 in the display area DA. In an exemplary embodiment of the present disclosure, the first active pattern 120 may include a polycrystalline silicon semiconductor. However, the present invention is not limited thereto, for example, the first active pattern 120 may include an oxide semiconductor.

The first active pattern 120 may include a first channel region 121, and a first source region 122 and a first drain region 123 at respective opposite ends of the first channel region 121. The first channel region 121 may include a polycrystalline silicon semiconductor to which impurities are not doped, and the first source region 122 and the first drain region 123 may include a polycrystalline silicon semiconductor to which impurities are doped.

The first active pattern 120 may be an n-type semiconductor or a p-type semiconductor. In an exemplary embodiment of the present disclosure, impurities doped in the first source region 122 and the first drain region 123 may be n-type impurities. For example, a material such as phosphorus (P) ions may be used as n-type impurities. According to an exemplary embodiment of the present disclosure, impurities doped in the first source region 122 and the first drain region 123 may be p-type impurities. For example, a material such as boron (B) ions may be used as p-type impurities.

The first gate insulation layer 125 covering the first active pattern 120 may be disposed on the buffer layer 115. In an exemplary embodiment of the present disclosure, the first gate insulation layer 125 may have a uniform thickness on the buffer layer 115 and may cover the first active pattern 120, and may further be disposed along a profile of the first active pattern 120. According to an exemplary embodiment of the present disclosure, the first gate insulation layer 125 may at least partially cover the first active pattern 120, and may have a substantially flat upper surface without generating a stepped region around the first active pattern 120. The first gate insulation layer 125 may include silicon oxide, silicon nitride, silicon oxynitride, etc.

A first gate pattern may be disposed on the first gate insulation layer 125. For example, the first gate pattern may include the first gate electrode 131. The first gate electrode 131 may at least partially overlap the first channel region 121 of the first active pattern 120. The first active pattern 120 and the first gate electrode 131 may form the driving thin film transistor TR1. The first gate pattern may include a metal such as aluminum (Al), silver (Ag), chromium (Cr), titanium (Ti), tantalum (Ta), Molybdenum (Mo), etc., an alloy thereof, a nitride thereof, a conductive metal oxide, a transparent conductive material, or the like.

The second gate insulation layer 135 covering the first gate pattern may be disposed on the first gate insulation layer 125. In an exemplary embodiment of the present disclosure, the second gate insulation layer 135 may have a uniform thickness on the first gate insulation layer 125 and may cover the first gate pattern, and may further be disposed along a profile of the first gate pattern. According to an exemplary embodiment of the present disclosure, the second gate insulation layer 135 may at least partially cover the first gate pattern, and may have a substantially flat upper surface without generating a stepped region around the first gate pattern. The second gate insulation layer 135 may include silicon oxide, silicon nitride, silicon oxynitride, etc.

A second gate pattern may be disposed on the second gate insulation layer 135. In an exemplary embodiment of the present disclosure, the second gate pattern may include the second gate electrode 141, the source connection electrode 142, and the drain connection electrode 143. In this case, the source connection electrode 142 and the drain connection electrode 143 may each be disposed on the same layer as the second gate electrode 141. The second gate electrode 141 may at least partially overlap the first gate electrode 131. The first gate electrode 131 and the second gate electrode 141 may form the capacitor CST.

The source connection electrode 142 may be in contact with the first source region 122 of the first active pattern 120, and the drain connection electrode 143 may be in contact with the first drain region 123 of the first active pattern 120. In an exemplary embodiment of the present disclosure, a first contact hole CH1 exposing a portion of the first source region 122 and a second contact hole CH2 exposing a portion of the first drain region 123 may each be formed through both the first gate insulation layer 125 and the second gate insulation layer 135. The source connection electrode 142 may fill the first contact hole CH1, and the drain connection electrode 143 may fill the second contact hole CH2. For example, an upper surface of the first source region 122 may be exposed by the first contact hole CH1, and an upper surface of the first drain region 123 may be exposed by the second contact hole CH2. Accordingly, a lower surface of the source connection electrode 142 may be in contact with the upper surface of the first source region 122, and a lower surface of the drain connection electrode 143 may be in contact with the upper surface of the first drain region 123. The second gate pattern may include a metal such as aluminum (Al), silver (Ag), chromium (Cr), titanium (Ti), tantalum (Ta), Molybdenum (Mo), etc., an alloy thereof, a nitride thereof, a conductive metal oxide, a transparent conductive material, or the like.

The first insulation interlayer 145 covering the second gate pattern may be disposed on the second gate insulation layer 135. In an exemplary embodiment of the present disclosure, the first insulation interlayer 145 may have a uniform thickness on the second gate insulation layer 135 and may cover the second gate pattern, and may further be disposed along a profile of the second gate pattern. According to an exemplary embodiment of the present disclosure, the first insulation interlayer 145 may at least partially cover the second gate pattern, and may have a substantially flat upper surface without generating a stepped region around the second gate pattern. The first insulation interlayer 145 may include silicon oxide, silicon nitride, silicon oxynitride, etc.

The second active pattern 150 may be disposed on the first insulation interlayer 145 in the display area DA. In an exemplary embodiment of the present disclosure, the second active pattern 150 may include an oxide semiconductor. However, the present invention is not limited thereto, and the second active pattern 150 may include a polycrystalline silicon semiconductor. The second active pattern 150 may include a second channel region 151, and a second source region 152 and a second drain region 153 at respective opposite ends of the second channel region 151.

The second active pattern 150 may include an oxide semiconductor including indium (In), zinc (Zn), gallium (Ga), tin (Sn), titanium (Ti), aluminum (Al), hafnium (Hf), zirconium (Zr), magnesium (Mg), etc. The second active pattern 150 may include a binary compound, a ternary compound, or quaternary compound. For example, the second active pattern 150 may include indium gallium zinc oxide (IGZO), indium tin zinc oxide (ITZO), gallium zinc oxide ($GaZn_xO_y$), indium zinc oxide (IZO), zinc magnesium oxide ($ZnMg_xO_y$), zinc oxide ($ZnO_x$), gallium oxide ($GaO_x$), tin oxide ($SnO_x$), indium oxide ($InO_x$), indium gallium hafnium oxide (IGHO), tin aluminum zinc oxide (TAZO), indium gallium tin oxide (IGTO), or the like. These may be used alone or in a combination with each other. In an exemplary embodiment of the present disclosure, lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), etc. may be doped in the aforementioned oxide semiconductor.

The third gate insulation layer 155 covering the second active pattern 150 may be disposed on the first insulation interlayer 145. In an exemplary embodiment of the present disclosure, the third gate insulation layer 155 may be disposed to at least partially overlap the second channel region 151 of the second active pattern 150. The third gate insulation layer 155 may include silicon oxide, silicon nitride, silicon oxynitride, etc.

A third gate pattern may be disposed on the third gate insulation layer 155. For example, the third gate pattern may include the third gate electrode 160. The third gate electrode 160 may at least partially overlap the second channel region 151 of the second active pattern 150. The second active pattern 150 and the second gate electrode 160 may form the switching thin film transistor TR2. The third gate pattern may include a metal such as aluminum (Al), silver (Ag), chromium (Cr), titanium (Ti), tantalum (Ta), Molybdenum (Mo), etc., an alloy thereof, a nitride thereof, a conductive metal oxide, a transparent conductive material, or the like.

The second insulation interlayer 165 covering the third gate pattern may be disposed on the first insulation interlayer 145. In an exemplary embodiment of the present disclosure, the second insulation interlayer 165 may at least partially cover the third gate pattern, and may have a substantially flat upper surface without generating a stepped region around the third gate pattern. According to an exemplary embodiment of the present disclosure, the second insulation interlayer 165 may have a uniform thickness on the first insulation interlayer 145 and may cover the third gate pattern, and may further be disposed along a profile of the third gate pattern. The second insulation interlayer 165 may include silicon oxide, silicon nitride, silicon oxynitride, etc.

A first source-drain pattern may be disposed on the second insulation interlayer 165. In an exemplary embodiment of the present disclosure, the first source-drain pattern may include the first source electrode 181, the first drain electrode 182, the second source electrode 183, and the second drain electrode 184.

The first source electrode 181 may be in contact with the source connection electrode 142, and the first drain electrode 182 may be in contact with the drain connection electrode 143. In an exemplary embodiment of the present disclosure, a third contact hole CH3 exposing a portion of the source connection electrode 142 and a fourth contact hole CH4 exposing a portion of the drain connection electrode 143 may be formed in the first insulation interlayer 145 and the second insulation interlayer 165. The first source electrode 181 may fill the third contact hole CH3, and the first drain electrode 182 may fill the fourth contact hole CH4. For example, an upper surface of the source connection electrode 142 may be exposed by the third contact hole CH3, and an upper surface of the drain connection electrode 143 may be exposed by the fourth contact hole CH4. Accordingly, a lower surface of the first source electrode 181 may be in contact with the upper surface of the source connection electrode 142, and a lower surface of the first drain electrode 182 may be in contact with the upper surface of the drain connection electrode 143.

If the source connection electrode 142 and the drain connection electrode 143 are not formed, the first source electrode 181 and the first drain electrode 182 may be in direct contact with the first source region 122 and the first drain region 123 of the first active pattern 120, respectively. In this case, as depths of contact holes exposing the first source region 122 and the drain region 123, respectively, increase, widths of the contact holes may decrease, particularly at lower regions closer to the substrate 110. Accordingly, a contact area between the first source electrode 181 and the first source region 122 may decrease thereby increasing a contact resistance between the first source electrode 181 and the first source region 122, and a contact area between the first drain electrode 182 and the first drain region 123 may decrease thereby increasing a contact resistance between the first drain electrode 182 and the first drain region 123. However, the thin film transistor substrate, according to an exemplary embodiment of the present invention, may include the source connection electrode 142 disposed between the first source region 122 and the first source electrode 181 and the drain connection electrode 143 disposed between the first drain region 123 and the first drain electrode 182. Therefore, the contact hole may be kept wide and contact resistance may be prevented from decreasing.

In an exemplary embodiment of the present disclosure, a width of the first contact hole CH1 and a width of the second contact hole CH2 may be greater than a width of the third contact hole CH3 and a width of the fourth contact hole CH4, respectively. Here, a width of a contact hole is a length of the contact hole in a direction in parallel with the base substrate 110. When the width of the first contact hole CH1 is greater than the width of the third contact hole CH3, a planar area of the source connection electrode 142 may be greater than a planar area of the first source electrode 181. Therefore, the first source electrode 181 may easily contact the source connection electrode 142, although a planar location of the third contact hole CH3 is slightly offset with respect to a planar location of the first contact hole CH1. Further, when the width of the second contact hole CH2 is greater than the width of the fourth contact hole CH4, a planar area of the drain connection electrode 143 may be greater than a planar area of the first drain electrode 182. Therefore, the first drain electrode 182 may easily contact the drain connection electrode 143 although a planar location of the fourth contact hole CH4 is slightly offset with respect to a planar location of the second contact hole CH2.

The second source electrode 183 may be in contact with the second source region 152 of the second active pattern 150, and the second drain electrode 184 may be in contact with the second drain region 153 of the second active pattern 150. In an exemplary embodiment of the present disclosure, a fifth contact hole CH5, exposing a portion of the second source region 152, and a sixth contact hole CH6, exposing a portion of the second drain region 153, may each be formed in the second insulation interlayer 165. The second source electrode 183 may fill the fifth contact hole CH5, and the second drain electrode 184 may fill the sixth contact hole CH6. For example, an upper surface of the second source region 152 may be exposed by the fifth contact hole CH5, and an upper surface of the second drain region 153 may be exposed by the sixth contact hole CH6. Accordingly, a lower surface of the second source electrode 183 may be in contact with the upper surface of the second source region 152, and a lower surface of the second drain electrode 184 may be in contact with the upper surface of the second drain region 153. The first source-drain pattern may include a metal such as aluminum (Al), silver (Ag), chromium (Cr), titanium (Ti), tantalum (Ta), Molybdenum (Mo), etc., an alloy thereof, a nitride thereof, a conductive metal oxide, a transparent conductive material, or the like.

An organic layer 175 may be disposed on the base substrate 110 within the bending area BA. Openings OP1 and OP2 may be formed in the buffer layer 155, the first gate insulation layer 125, the second gate insulation layer 135, the first insulation interlayer 145, and the second insulation interlayer 165 within the bending area BA, and the organic layer 175 may be disposed on the base substrate 110 within the bending area BA and may fill at least a portion of the openings OP1 and OP2. In an exemplary embodiment of the present disclosure, the openings OP1 and OP2 may include a first opening OP1 corresponding to the first insulation interlayer 145 and the second insulation interlayer 165, and a second opening OP2 corresponding to the buffer layer 115, the first gate insulation layer 125, and the second gate insulation layer 135. In an exemplary embodiment of the present disclosure, the organic layer 175 may be disposed on the second insulation interlayer 165 and may fill the openings OP1 and OP2. The organic layer 175 may include an organic material such as photoresist, polyacrylate based resin, polyimide based resin, polyamide based resin, siloxane based resin, acryl based resin, epoxy base resin, or the like.

The first source-drain pattern may further include a first wiring 185 disposed on the organic layer 175. The first wiring 185 may extend from the first area DA to the second area PA through the bending area BA. The organic layer 175 may have a hardness that is less than that of an inorganic layer such as the buffer layer 115, the first gate insulation layer 125, the second gate insulation layer 135, the first insulation interlayer 145, and the second insulation interlayer 165, thereby absorbing tensile stress generated by bending of the display device. Accordingly, concentration of tensile stress to the first wiring 185 may be effectively prevented.

Conductive layers 134a and 134b may be disposed at an end of the first area DA adjacent to the bending area BA and at an end of the second area PA adjacent to the bending area BA, respectively. In an exemplary embodiment of the present disclosure, the conductive layers 134a and 134b may be disposed between the first gate insulation layer 125 and the second gate insulation layer 135. In this case, the first gate pattern may further include the conductive layers 134a and 134b. The first wiring 185 may be in contact with the conductive layers 134a and 134b through contact hole formed in the insulation layers. The conductive layer 134a disposed on the base substrate 110 in the first area DA may be electrically connected to an element (e.g., the pixel) disposed in the first area DA, and the conductive layer 134b disposed on the base substrate 110 in the second area PA may be electrically connected to an element (e.g., the pad) disposed in the second area PA. Accordingly, the element disposed in the first area DA and the element disposed in the second area PA may be electrically connected to each other through the first wiring 185.

Hereinafter, a method of manufacturing the thin film transistor substrate in FIG. 4 will be described with reference to FIGS. 5 to 15. First, an example of a method of manufacturing a thin film transistor substrate will be described with reference to FIGS. 5 to 12.

FIGS. 5 to 12 are cross-sectional views illustrating an example of a method of manufacturing the thin film transistor substrate in FIG. 4.

Figure 5:
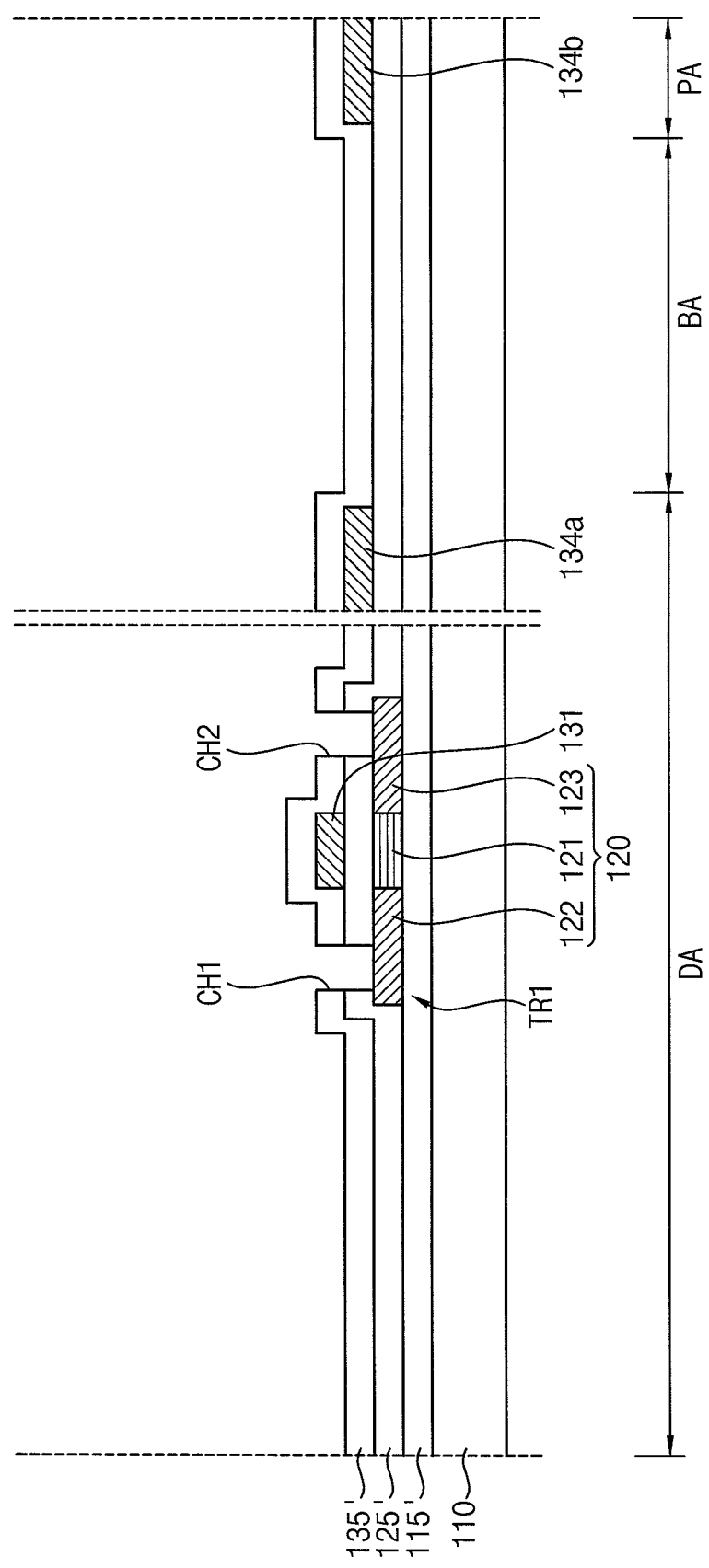
FIGS. 5 to 15 are cross-sectional views illustrating a method of manufacturing the thin film transistor substrate in FIG. 4.

Referring to FIG. 5, the base substrate 110 including transparent or opaque material may be formed on a hard glass substrate. The base substrate 110 may be formed of a flexible transparent resin substrate. In an exemplary embodiment of the present disclosure, the base substrate 110 may include a first organic layer, a first barrier layer, a second organic layer, and a second barrier layer, which are sequentially layered. The first barrier layer and the second barrier layer may be formed of an inorganic material. Further, the first organic layer and the second organic layer may be formed of an organic material. For example, the first and second barrier layers may each include silicon oxide, and the first and second barrier layers may each block moisture permeating through the first and second organic layers. The first and second organic layers may include polyimide based resin.

A preliminary buffer layer 115' may be formed on the base substrate 110. In an exemplary embodiment of the present disclosure, the preliminary buffer layer 115' may be formed on the base substrate 110 in the first area DA, the second area PA, and the buffer area BA. The preliminary buffer layer 115' may be formed of silicon oxide, silicon nitride, silicon oxynitride, etc.

The first active pattern 120 may be formed on the preliminary buffer layer 115' in the first area DA. In an exemplary embodiment of the present disclosure, the first active pattern 120 may be formed of silicon semiconductor, or the like. For example, a first semiconductor layer may be entirely formed on the preliminary buffer layer 115', and the first semiconductor layer may be selectively etched to form the first active pattern 120.

A preliminary first gate insulation layer 125' may be formed on the first active pattern 120. The preliminary first gate insulation layer 125' may be entirely formed on the preliminary buffer layer 115' and may cover the first active pattern 120. For example, the preliminary first gate insulation layer 125' may be formed on the preliminary buffer layer 115' along a profile of the first active pattern 120 with a uniform thickness and may cover the first active pattern 120. The preliminary first gate insulation layer 125' may be formed of silicon oxide, silicon nitride, silicon oxynitride, etc.

The first gate pattern including first gate electrode 131 and the conductive layers 134a and 134b may be formed on the preliminary first gate insulation layer 125'. The first gate pattern may be formed of a metal, an alloy thereof, a nitride thereof, a conductive metal oxide, a transparent conductive material, etc. For example, a first conductive layer may be entirely formed on the preliminary first gate insulation layer 125', and the first conductive layer may be selectively etched to form the first gate electrode 131 on the first active pattern 120 and to form the conductive layers 134a and 134b at an end of the first area DA and an end of the second area PA, respectively. According to the formation of the first gate electrode 131, the driving thin film transistor TR1 including the first active pattern 120 and the first gate electrode 131 may be formed.

A preliminary second gate insulation layer 135' may be formed on the first gate pattern. The preliminary second gate insulation layer 135' may be entirely formed on the preliminary first gate insulation layer 125' and may cover the first gate electrode 131 and the conductive layers 134a and 134b. For example, the preliminary second gate insulation layer 135' may be formed on the preliminary first gate insulation layer 125' along a profile of the first gate pattern with a uniform thickness and may cover the first gate pattern. The preliminary second gate insulation layer 135' may be formed of silicon oxide, silicon nitride, silicon oxynitride, etc.

The first contact hole CH1 exposing a portion of the first source region 122 of the first active pattern 120 and the second contact hole CH2 exposing a portion of the first drain region 123 of the first active pattern 120 may be formed. For example, the preliminary first gate insulation layer 125' and the preliminary second gate insulation layer 135' may be selectively etched to form the first contact hole CH1 and the second contact hole CH2 passing through the preliminary first gate insulation layer 125' and the preliminary second gate insulation layer 135'. A portion of an upper surface of the first source region 122 may be exposed by the first contact hole CH1, and a portion of an upper surface of the first drain region 123 may be exposed by the second contact hole CH2.

After the formation of the first contact hole CH1 and the second contact hole CH2, an annealing process of the driving thin film transistor TR1 may be performed. Hydrogen (H) included in the preliminary first gate insulation layer 125' and/or the preliminary second gate insulation layer 135' may be permeated into the first active pattern 120, and the permeated hydrogen may connect parts of polycrystalline silicon included in the first active pattern 120 in which hydrogen bonds are disconnected. Transfer characteristics of the first channel region 121 of the first active pattern 120 may be increased by the connection, therefore, characteristics of the driving thin film transistor TR1 may be made better. A wet cleaning process may be performed for the first contact hole CH1 and the second contact hole CH2 after the annealing process. The wet cleaning process may be performed by a buffered oxide etchant (BOE). An oxide, etc., formed during the annealing process may be removed by the wet cleaning process.

Figure 6:
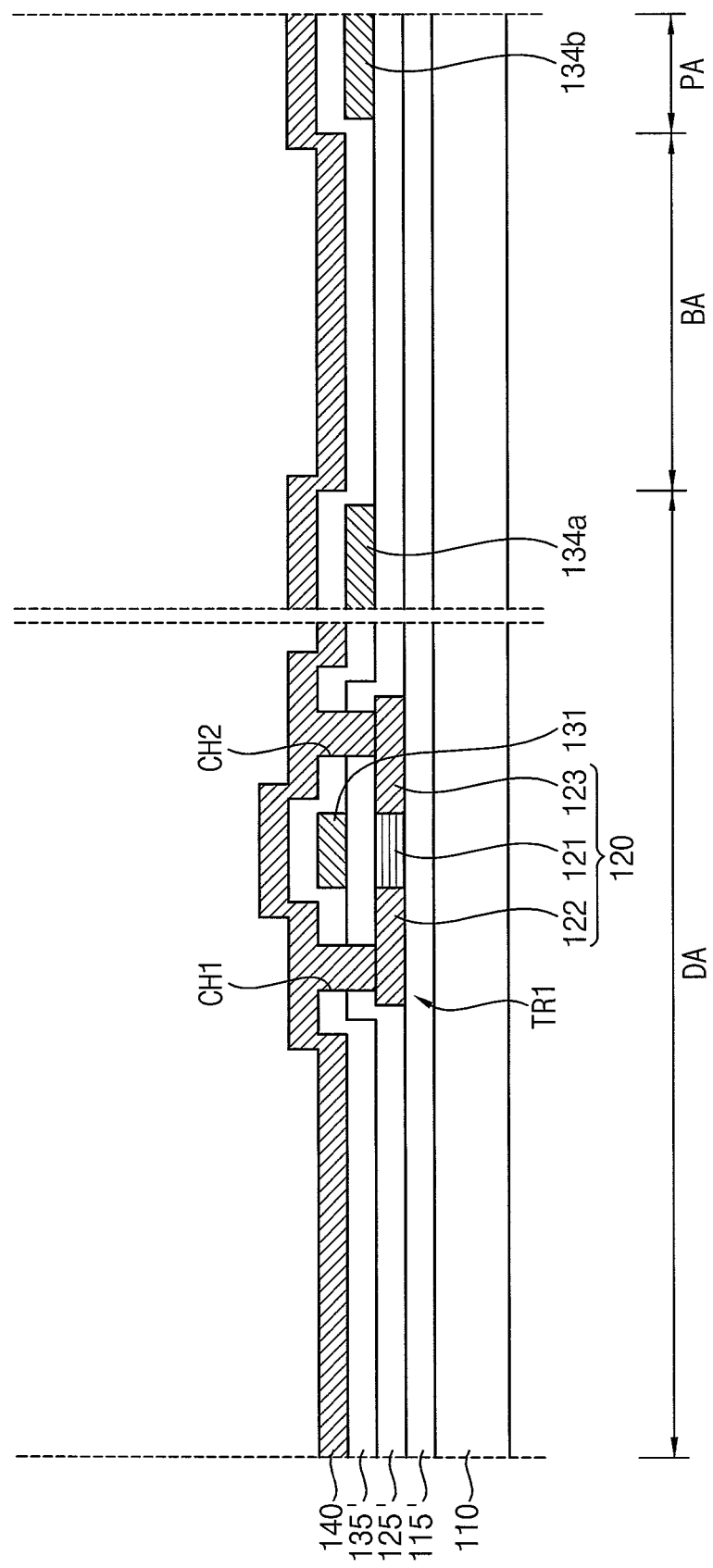

Referring to FIG. 6, a second conductive layer 140 may be formed on the preliminary second gate insulation layer 135', filling the first contact hole CH1 and the second contact hole CH2. The second conductive layer 140 may be in contact with the upper surface of the first source region 122 exposed by the first contact hole CH1 and the upper surface of the first drain region 123 exposed by the second contact hole CH2. The second conductive layer 140 may be formed of a metal, an alloy thereof, a nitride thereof, a conductive metal oxide, a transparent conductive material, etc. For example, the second conductive layer 140 may be entirely formed on the preliminary second gate insulation layer 135'.

Figure 7:
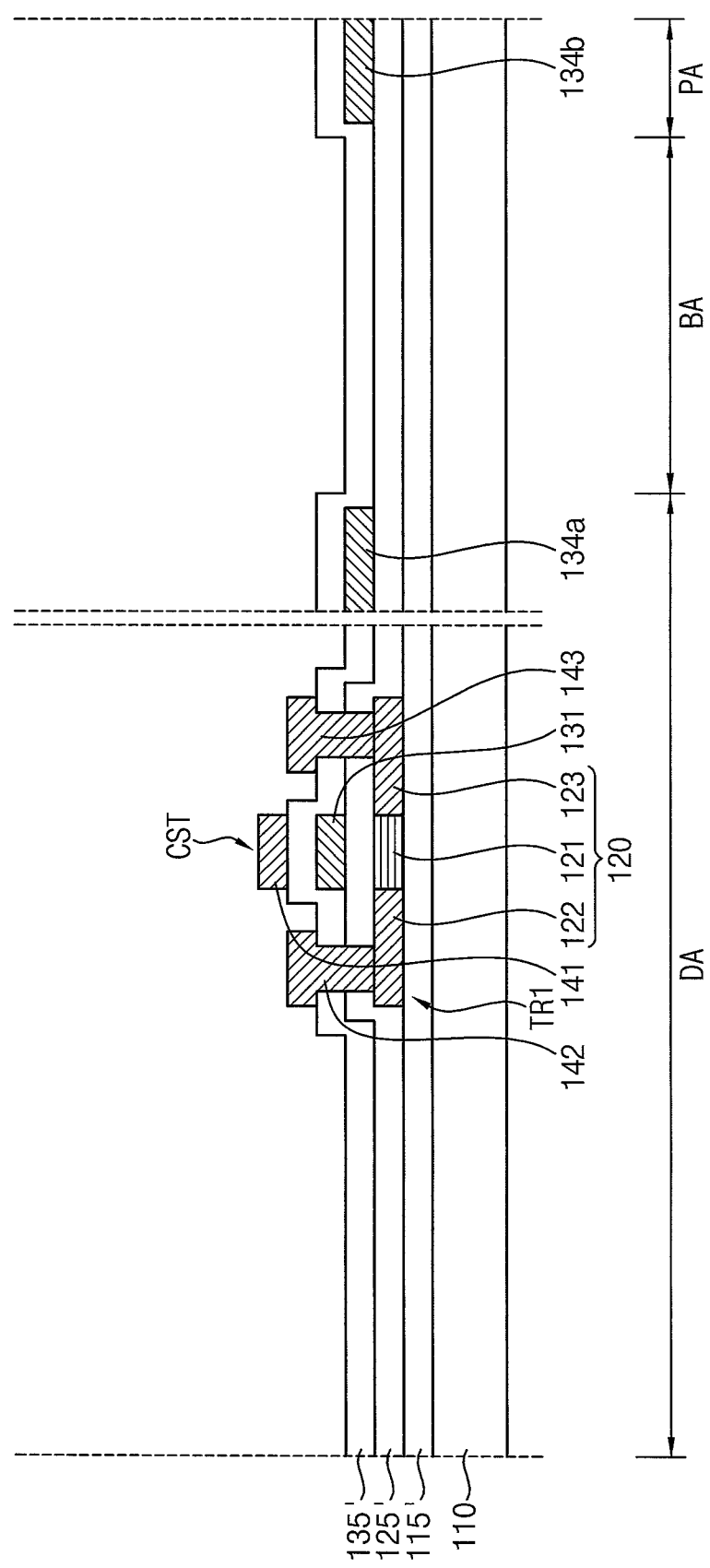

Referring to FIG. 7, the second conductive layer 140 may be selectively etched to form the second gate pattern including the second gate electrode 141, the source connection electrode 142, and the drain connection electrode 143. The second gate electrode 141 may be formed over the first gate electrode 131 to at least partially overlap the first gate electrode 131, and the source connection electrode 142 and the drain connection electrode 143 which are in contact with the first source region 122 and the first drain region 123 of the first active pattern 120, respectively, may be formed. For example, a lower surface of the source connection electrode 142 and a lower surface of the drain connection electrode 143 may be in contact with the upper surface of the first source region 122 and the upper surface of the first drain region 123, respectively. According to the formation of the second gate electrode 141, the capacitor CST including the first gate electrode 131 and the second gate electrode 141 may be formed.

Figure 8:
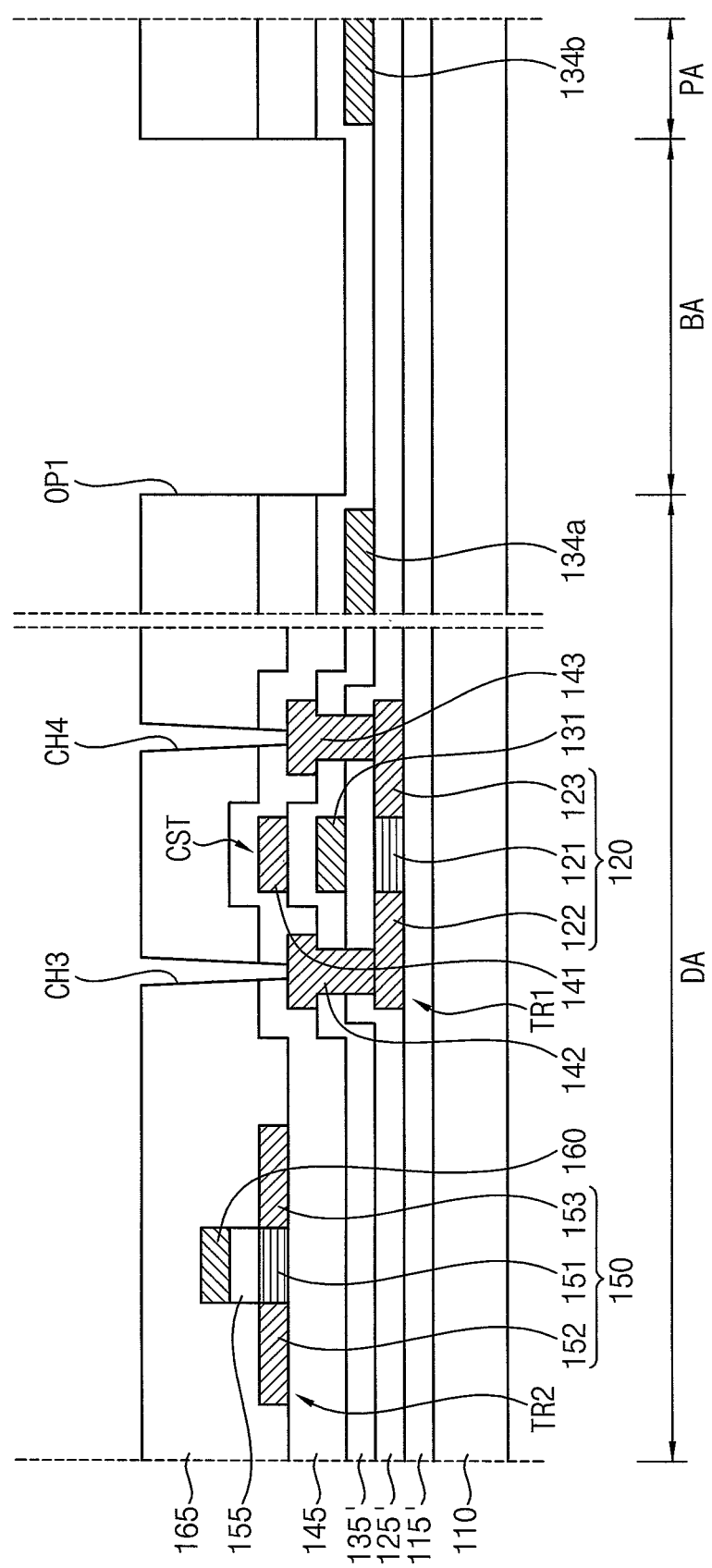

Referring to FIG. 8, a preliminary first insulation interlayer may be formed on the second gate pattern. The preliminary first insulation interlayer may be entirely formed on the preliminary second gate insulation layer 135' and may cover the second gate electrode 141, the source connection electrode 142, and the drain connection electrode 143. For example, the preliminary first insulation interlayer may be formed on the preliminary second gate insulation layer 135' along a profile of the second gate pattern with a uniform thickness and may cover the second gate pattern. The preliminary first insulation interlayer may be formed of silicon oxide, silicon nitride, silicon oxynitride, etc.

The second active pattern 150 may be formed on the preliminary first insulation interlayer in the first area DA. In an exemplary embodiment of the present disclosure, the second active pattern 150 may be formed of an oxide semiconductor. For example, the second semiconductor layer may be entirely formed on the preliminary first insulation interlayer, and the second semiconductor layer may be selectively etched to form the second active pattern 150.

The third gate insulation layer 155 and the third gate pattern including the third gate electrode 160 may be sequentially formed on the second active pattern 150. The third gate insulation layer 155 may be formed of silicon oxide, silicon nitride, silicon oxynitride, etc., and the third gate pattern may be formed of a metal, an alloy thereof, a nitride thereof, a conductive metal oxide, a transparent conductive material, etc. The third gate insulation layer 155 may be formed to at least partially overlap the second channel region 151 of the second active pattern 150 and may cover the second active pattern 150, and the third gate electrode 160 may be formed on the third gate insulation layer 155 to at least partially overlap the second channel region 151 of the second active pattern 150. For example, a preliminary third gate insulation layer and a third conductive layer may be entirely sequentially formed on the preliminary first insulation interlayer and may cover the second active pattern 150, and the preliminary third gate insulation layer and the third conductive layer may be selectively etched to form the third gate insulation layer 155 on the second channel region 151 of the second active pattern 150 and to form the third gate electrode 160 on the third gate insulation layer 155. According to the formation of the third gate electrode 160, the switching thin film transistor TR2 including the second active pattern 150 and the third gate electrode 160 may be formed.

A preliminary second insulation interlayer may be formed on the third gate pattern. The preliminary second insulation interlayer may be entirely formed on the preliminary first insulation interlayer and may cover the second active pattern 150 and the third gate electrode 160. For example, the preliminary second insulation interlayer may at least partially cover the third gate electrode 160 on the preliminary first insulation interlayer, and may have a substantially flat upper surface without generating a stepped region around the third gate electrode 160. The preliminary second insulation interlayer may be formed of silicon oxide, silicon nitride, silicon oxynitride, etc.

The third contact hole CH3 exposing a portion of the source connection electrode 142 and the fourth contact hole CH4 exposing a portion of the drain connection electrode 143 may be formed. For example, the preliminary first insulation interlayer and the preliminary second insulation interlayer may be selectively etched to form the third contact hole CH3 and the fourth contact hole CH4 passing through the preliminary first insulation interlayer and the preliminary second insulation interlayer. A portion of an upper surface of the source connection electrode 142 may be exposed by the third contact hole CH3, and a portion of an upper surface of the drain connection electrode 143 may be exposed by the fourth contact hole CH4. After the formation of the third contact hole CH3 and the fourth contact hole CH4, an annealing process of the driving thin film transistor TR1 and the switching thin film transistor TR2 may be performed.

In an exemplary embodiment of the present disclosure, a width of the third contact hole CH3 and a width of the fourth contact hole CH4 may be less than a width of the first contact hole CH1 and a width of the second contact hole CH2, respectively. When the width of the third contact hole CH3 is less than the width of the first contact hole CH1, the first source electrode 181 formed in a following process may easily contact the source connection electrode 142 although a planar location of the third contact hole CH3 is slightly offset with respect to a planar location of the first contact hole CH1. Further, when the width of the fourth contact hole CH4 is less than the width of the second contact hole CH2, the first drain electrode 182 formed in a following process may easily contact the drain connection electrode 143 although a planar location of the fourth contact hole CH4 is slightly offset with respect to a planar location of the second contact hole CH2.

The preliminary first insulation interlayer and the preliminary second insulation interlayer may be selectively etched to form the first insulation interlayer 145 and the second insulation interlayer 165. The first opening OP1 passing through the preliminary first insulation interlayer and the preliminary second insulation interlayer may be formed within the bending area BA, therefore, the first insulation interlayer 145 and the second insulation interlayer 165 may be selectively disposed in the first area DA and the second area PA on the base substrate 110. In an exemplary embodiment of the present disclosure, the first opening OP1 may be formed at substantially the same time as the third contact hole CH3 and the fourth contact hole CH4. As used herein, the phrase "at substantially the same time" may mean that the aforementioned elements are formed together during a single processing step.

Figure 9:
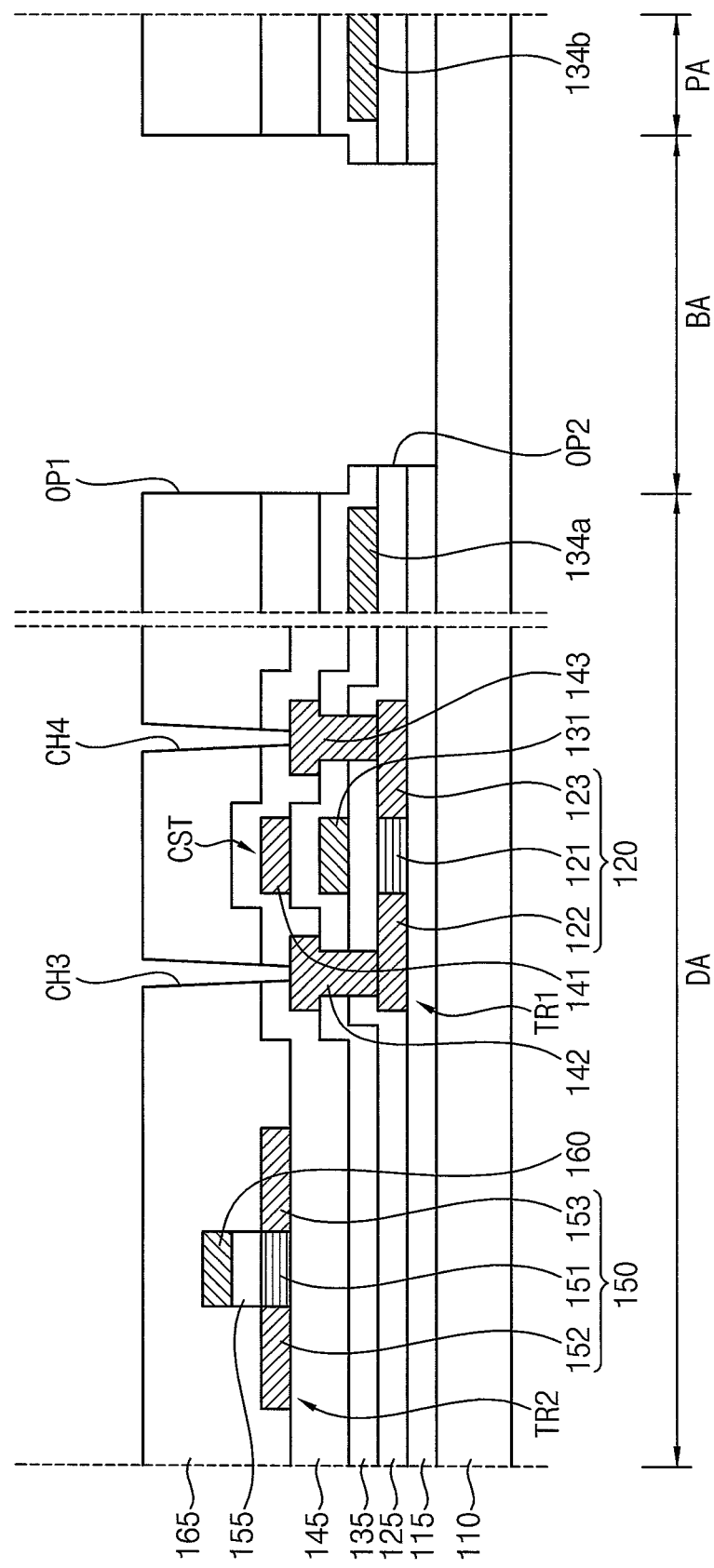

Referring to FIG. 9, the preliminary buffer layer 115', the preliminary first gate insulation layer 125', and the preliminary second gate insulation layer 135' may be selectively etched to form the buffer layer 115, the first gate insulation layer 125, and the second gate insulation layer 135. The second opening OP2 passing through the preliminary buffer layer 115', the preliminary first gate insulation layer 125', and the preliminary second gate insulation layer 135' may be formed within the bending area BA, therefore, the buffer layer 115, the first gate insulation layer 125, and the second gate insulation layer 135 may be selectively disposed in the first area DA and the second area PA on the base substrate 110. In an exemplary embodiment of the present disclosure, a width of the second opening OP2 may be less than a width of the first opening OP1.

Figure 10:
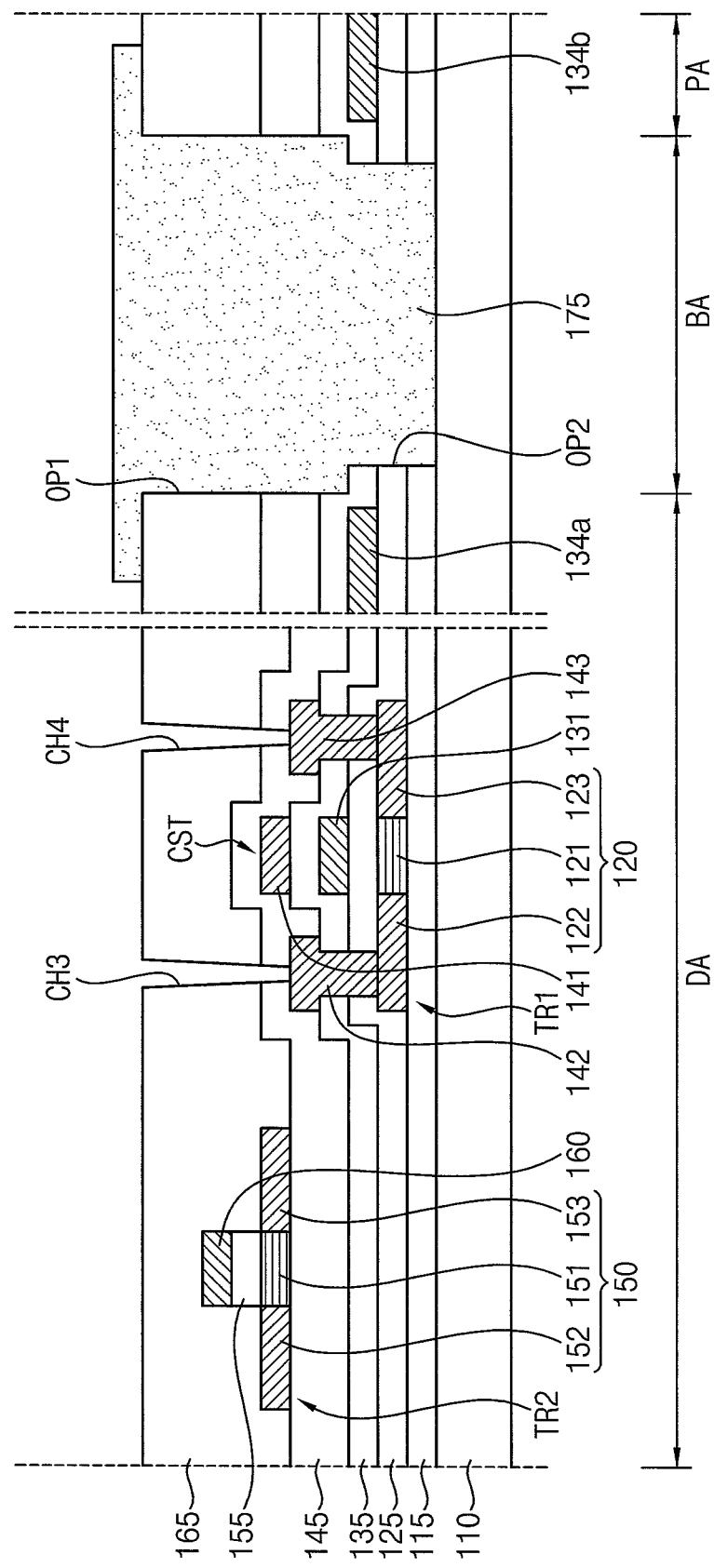

Referring to FIG. 10, the organic layer 175 may be formed on the bending area BA of the base substrate 110 which is exposed by the first opening OP1 and the second opening OP2. For example, a preliminary organic layer may be entirely formed on the second insulation interlayer 165, and the preliminary organic layer may be selectively etched to form the organic layer 175. In an exemplary embodiment of the present disclosure, the organic layer 175 may partially cover the second insulation interlayer 165 while entirely filling the first opening OP1 and the second opening OP2. The organic layer 175 may be formed of an organic material such as photoresist, polyacrylate based resin, polyimide based resin, polyamide based resin, siloxane based resin, acryl based resin, epoxy base resin, or the like.

Figure 11:
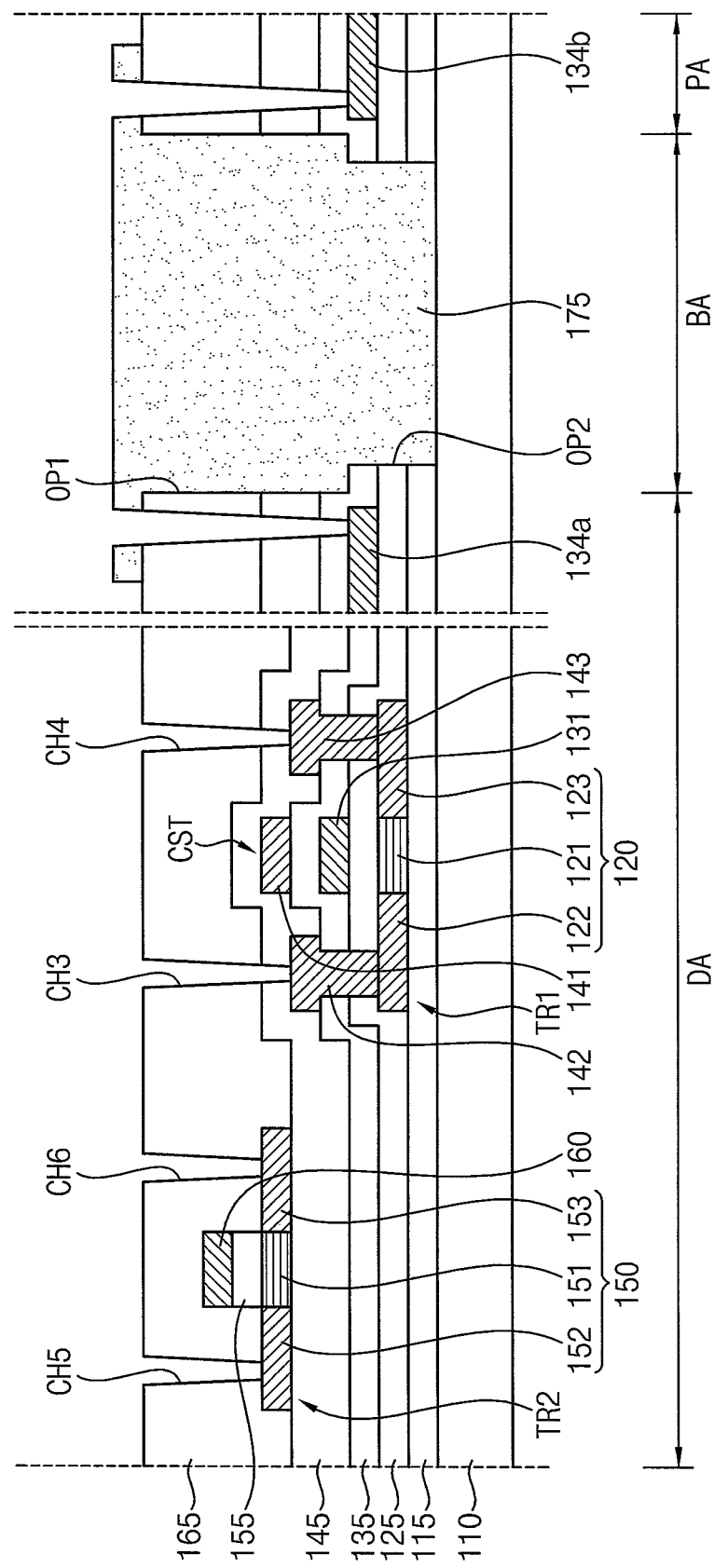

Referring to FIG. 11, the fifth contact hole CH5 exposing a portion of the second source region 152 of the second active pattern 150 and the sixth contact hole CH6 exposing a portion of the second drain region 153 of the second active pattern 150 may be formed. For example, the second insulation interlayer 165 may be selectively etched to form the fifth contact hole CH5 and the sixth contact hole CH6 passing through the second insulation interlayer 165. A portion of an upper surface of the second source region 152 may be exposed by the fifth contact hole CH5, and a portion of an upper surface of the second drain region 153 may be exposed by the sixth contact hole CH6. Further, contact holes exposing the conductive layers 134a and 134b, respectively, may be formed in the second gate insulation layer 135, the first insulation interlayer 145, the second insulation interlayer 165, and the organic layer 175. In an exemplary embodiment of the present disclosure, the contact holes exposing the conductive layers 134a and 134b, respectively, may be formed with the fifth contact hole CH5 and the sixth contact hole CH6 at substantially the same time.

TABLE 1

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| Prior art | 10928 Ω | 14925 Ω | 16396 Ω | 15102 Ω | 12951 Ω | 17040 Ω | 13497 Ω | 20862 Ω | 5262.7 Ω |
| Present invention | 1357.7 Ω | 1320.7 Ω | 1458.3 Ω | 1355.3 Ω | 1321.5 Ω | 1379.5 Ω | 1362.3 Ω | 1333.5 Ω | 1347.3 Ω |

Figure 12:
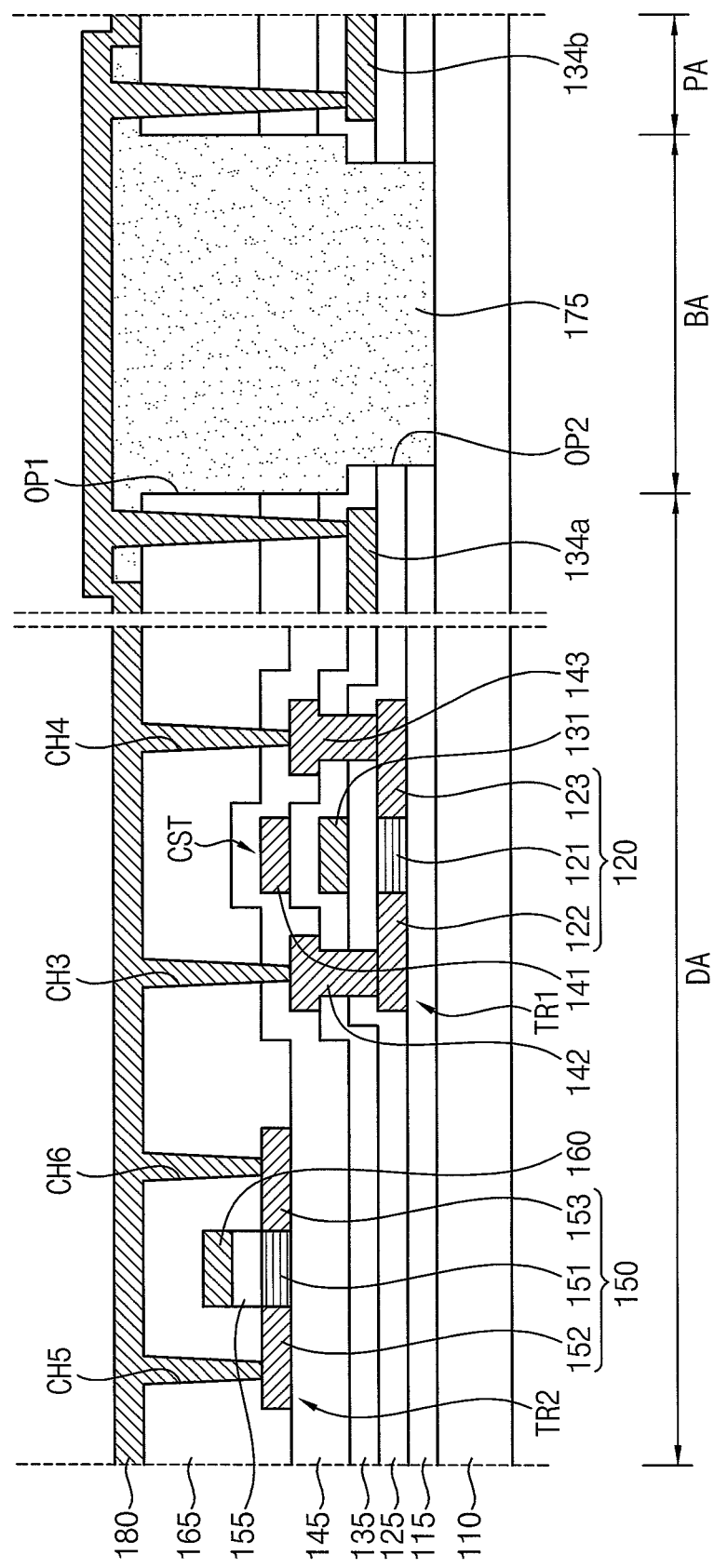

Referring to FIG. 12, a fourth conductive layer 180 filling the third contact hole CH3, the fourth contact hole CH4, the fifth contact hole CH5, the sixth contact hole CH6, and the contact holes exposing the conductive layers 134a and 134b may be formed on the second insulation layer 165 and the organic layer 175. The fourth conductive layer 180 may be formed of a metal, an alloy thereof, a nitride thereof, a conductive metal oxide, a transparent conductive material, etc. For example, the fourth conductive layer 180 may be entirely formed on the second insulation layer 165 and the organic layer 175.

Referring to FIG. 4, the fourth conductive layer 180 may be selectively etched to form the first source-drain pattern including the first source electrode 181, the first drain electrode 182, the second source electrode 183, the second drain electrode 184, and the first wiring 185. The first source electrode 181 and the first drain electrode 182 in contact with the source connection electrode 142 and the drain connection electrode 143, respectively, the second source electrode 183 and the second drain electrode 184 in contact with the second source region 152 and the second drain region 153 of the second active pattern 150, respectively, and the first wiring 185 in contact with the conductive layers 134a and 134b may be formed at substantially the same time.

If the source connection electrode 142 and the drain connection electrode 143 are not formed, the first source electrode 181 and the first drain electrode 182 may be in direct contact with the first source region 122 and the first drain region 123 of the first active pattern 120, respectively. In this case, in the process of etching the insulation layers within the bending area BA by using photoresist and forming the fifth contact hole CH5 and sixth contact hole CH6 after the formation of contact holes exposing the first source region 122 and the first drain region 123, respectively, photoresist particles may be in contact with or remain in the contact holes, so that a contact resistance between the first source region 122 and the first source electrode 181 and a contact resistance between the first drain region 123 and the first drain electrode 182 may increase. However, in the method of manufacturing the thin film transistor substrate, according to an exemplary embodiment of the present invention, the source connection electrode 142 the drain connection electrode 143 in direct contact with the upper surface of the first source region 122 and the upper surface of the first drain region 123, respectively, may be formed. Therefore, increase of a contact resistance caused by the presence of photoresist particles may be prevented.

Table 1 below illustrates contact resistances between the first source region 122 of the first active pattern 120 and the first source electrode 181 in a comparative example in which the source connection electrode 142 and the drain connection electrode 143 are not formed and contact resistances between the first source region 122 of the first active pattern 120 and the source connection electrode 142 in the present invention in which the source connection electrode 142 and the drain connection electrode 143 are formed.

Referring to Table 1, a contact resistance between the first source region 122 of the first active pattern 120 and the first source connection electrode 142 of the thin film transistor substrate, according to the present approach in which the source connection electrode 142 and the drain connection electrode 143 are formed, may be less than a contact resistance between the first source region 122 of the first active pattern 120 and the first source electrode 181 of the thin film transistor substrate, according to the comparative example in which the source connection electrode 142 and the drain connection electrode 143 are not formed.

Hereinafter, a method of manufacturing a thin film transistor substrate, according to exemplary embodiments of the present invention, will be described with reference to FIGS. 13 to 15.

Figure 13:
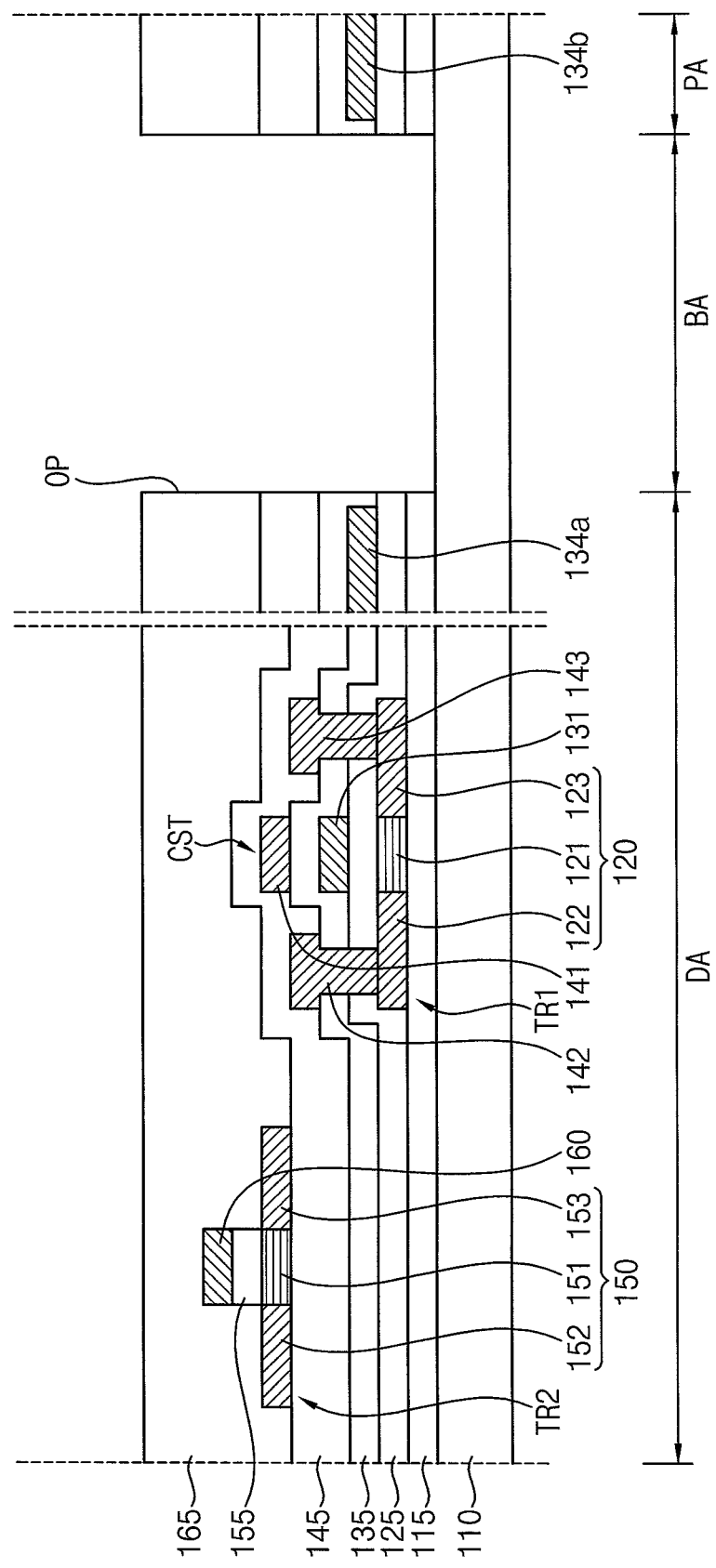
Figure 14:
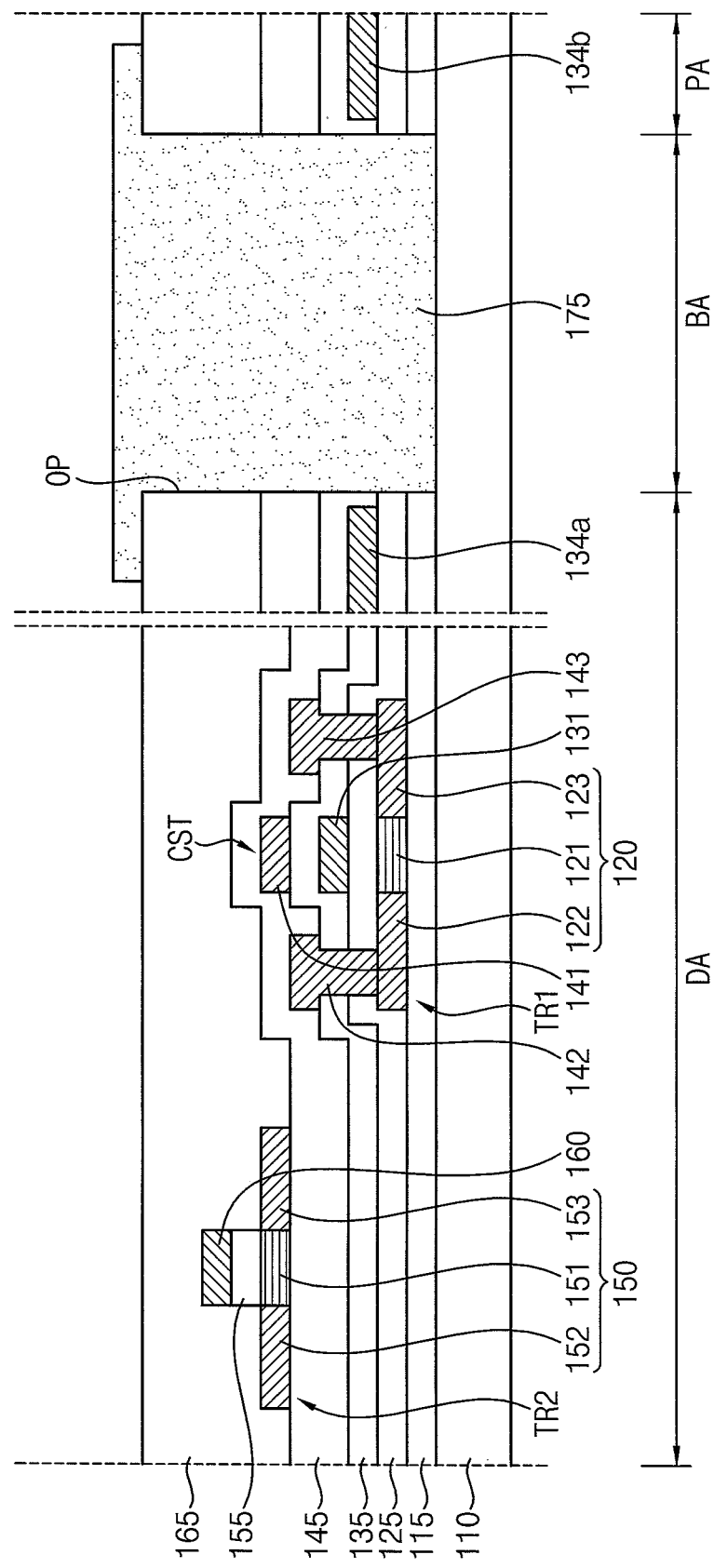
Figure 15:
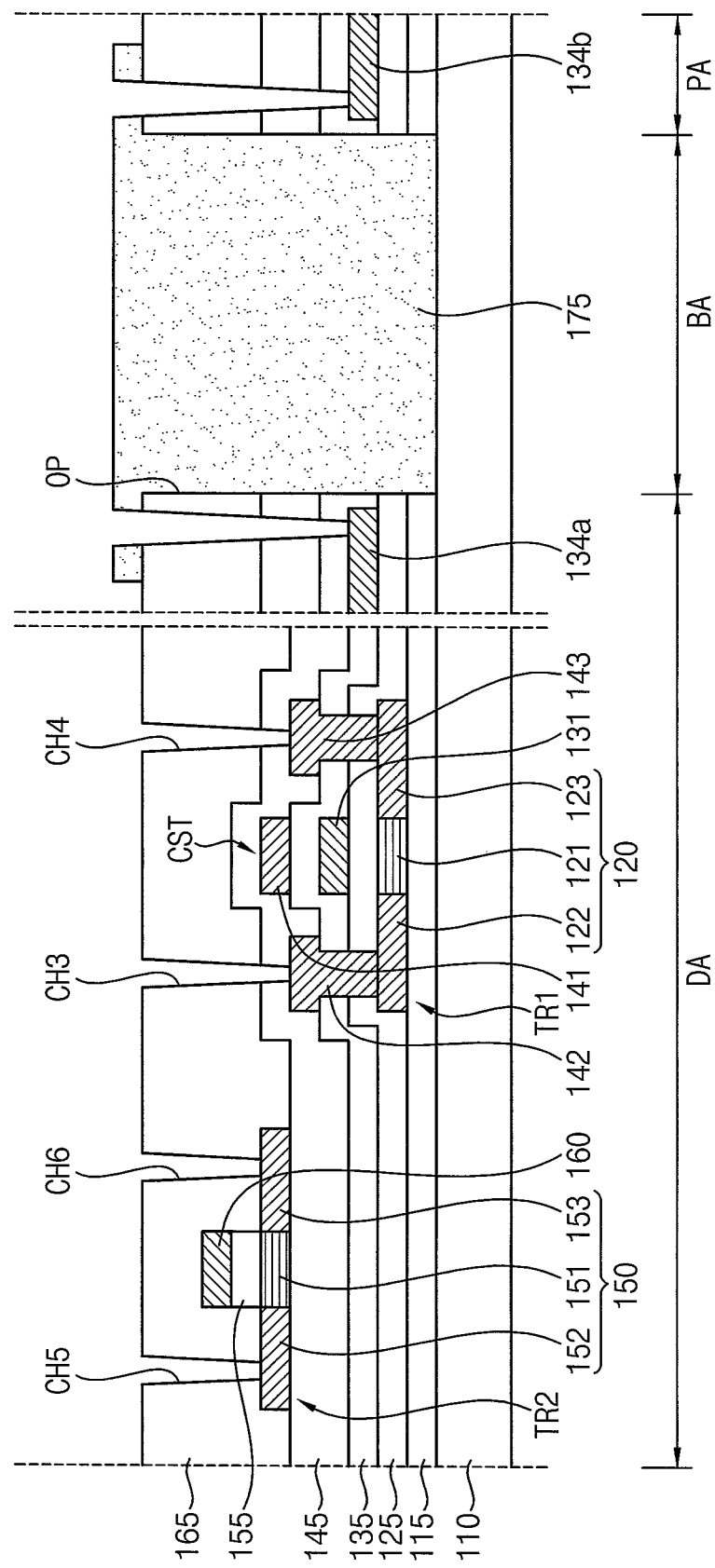

FIGS. 13 to 15 are cross-sectional views illustrating a method of manufacturing the thin film transistor substrate in FIG. 4, according to an exemplary embodiment of the present disclosure. In describing the arrangement shown in FIGS. 13 to 15, elements whose description has been omitted may be assumed to be at least similar to elements previously described with reference to FIGS. 5 to 12.

Referring to FIG. 13, in the thin film transistor substrate in which the preliminary second insulation interlayer is formed, the preliminary buffer layer 115', the preliminary first gate insulation layer 125', the preliminary second gate insulation layer 135', the preliminary first insulation interlayer, and the preliminary second insulation interlayer may be selectively etched to form the buffer layer 115, the first gate insulation layer 125, the second gate insulation layer 135, the first insulation interlayer 145, and the second insulation interlayer 165. An opening OP passing through the preliminary buffer layer 115', the preliminary first gate insulation layer 125', the preliminary second gate insulation layer 135', the preliminary first insulation interlayer, and the preliminary second insulation interlayer may be formed within the bending area BA, therefore, the buffer layer 115, the first gate insulation layer 125, the second gate insulation layer 135, the first insulation interlayer 145, and the second insulation interlayer 165 may be selectively disposed in the first area DA and the second area PA on the base substrate 110.

Referring to FIG. 14, the organic layer 175 may be formed on the bending area BA of the base substrate 110 which is exposed by the opening OP. For example, a preliminary organic layer may be entirely formed on the second insulation interlayer 165, and the preliminary organic layer may be selectively etched to form the organic layer 175. In an exemplary embodiment of the present disclosure, the organic layer 175 may partially cover the second insulation interlayer 165 and may entirely fill the opening OP.

Referring to FIG. 15, the third contact hole CH3 exposing a portion of the source connection electrode 142, the fourth contact hole CH4 exposing a portion of the drain connection electrode 143, the fifth contact hole CH5 exposing a portion of the second source region 152 of the second active pattern 150, and the sixth contact hole CH6 exposing a portion of the second drain region 153 of the second active pattern 150 may be formed. The third contact hole CH3, the fourth contact hole CH4, the fifth contact hole CH5, and the sixth contact hole CH6 may be formed at substantially the same time. For example, the first insulation interlayer 145 and the second insulation interlayer 165 may be selectively etched to form the third contact hole CH3 and the fourth contact hole CH4 passing through the first insulation interlayer 145 and the second insulation interlayer 165, and the second insulation interlayer 165 may be selectively etched to form the fifth contact hole CH5 and the sixth contact hole CH6 passing through the second insulation interlayer 165. A portion of the source connection electrode 142 may be exposed by the third contact hole CH3, and a portion of the drain connection electrode 143 may be exposed by the fourth contact hole CH4. A portion of an upper surface of the second source region 152 may be exposed by the fifth contact hole CH5, and a portion of an upper surface of the second drain region 153 may be exposed by the sixth contact hole CH6. Further, contact holes exposing the conductive layers 134a and 134b, respectively, may be formed in the second gate insulation layer 135, the first insulation interlayer 145, the second insulation interlayer 165, and the organic layer 175. In an exemplary embodiment of the present disclosure, the contact holes exposing the conductive layers 134a and 134b, respectively, may be formed at substantially the same time as the third contact hole CH3, the fourth contact hole CH4, the fifth contact hole CH5, and the sixth contact hole CH6.

Hereinafter, a cross-sectional structure of a thin film transistor substrate of the display device according to an exemplary embodiment of the present disclosure will be described with reference to FIG. 16.

Figure 16:
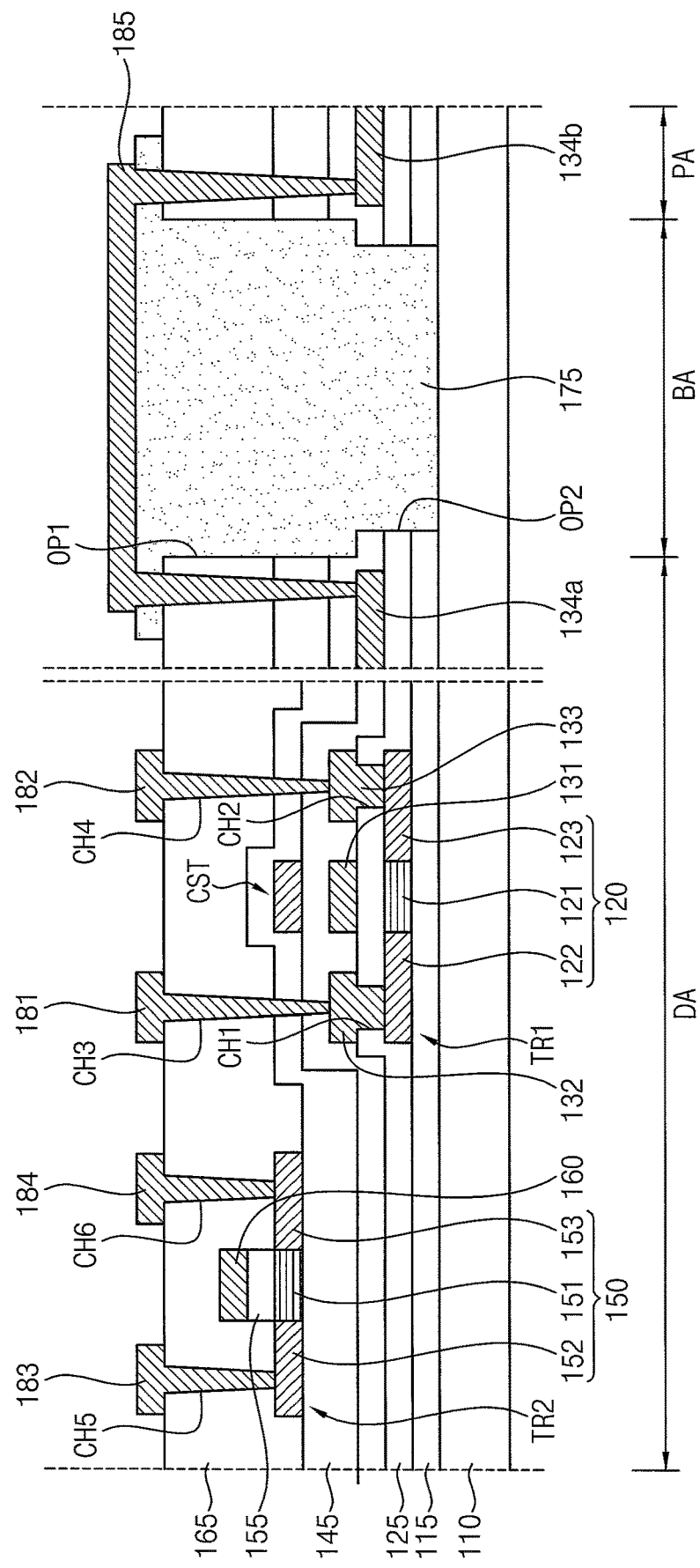
FIG. 16 is a cross-sectional view illustrating a thin film transistor substrate according to an exemplary embodiment of the present disclosure.

FIG. 16 is a cross-sectional view illustrating a thin film transistor substrate according to an exemplary embodiment of the present disclosure. The thin film transistor substrate illustrated in FIG. 16 may include the driving thin film transistor TR1, the switching thin film transistor TR2, and the capacitor CST of the display device.

Referring to FIG. 16, the thin film transistor substrate, according to an exemplary embodiment of the present disclosure, may include a first active pattern 120, a first gate insulation layer 125, a first gate electrode 131, a source connection electrode 132, a drain connection electrode 133, a second gate insulation layer 135, a second gate electrode 141, a first insulation interlayer 145, a second active pattern 150, a third gate insulation layer 155, a third gate electrode 160, a second insulation interlayer 165, a first source electrode 181, a first drain electrode 182, a second source electrode 183, and a second drain electrode 184 provided on a base substrate 110. The first area DA, the second area PA, and the bending area BA of the display device may be defined in the thin film transistor substrate. In describing the arrangement shown in FIG. 16, elements whose description has been omitted may be assumed to be at least similar to elements previously described with reference to FIG. 4.

A first gate pattern may be disposed on the first gate insulation layer 125. For example, the first gate pattern may include the first gate electrode 131, the source connection electrode 132, and the drain connection electrode 133. In this case, the source connection electrode 132 and the drain connection electrode 133 may be disposed on the same layer as the first gate electrode 131.

The source connection electrode 132 may be in contact with the first source region 122 of the first active pattern 120, and the drain connection electrode 133 may be in contact with the first drain region 123 of the first active pattern 120. In an exemplary embodiment of the present disclosure, a first contact hole CH1 exposing a portion of the first source region 122 and a second contact hole CH2 exposing a portion of the first drain region 123 may be formed in the first gate insulation layer 125. The source connection electrode 132 may fill the first contact hole CH1, and the drain connection electrode 133 may fill the second contact hole CH2.

A second gate pattern may be disposed on the second gate insulation layer 135. In an exemplary embodiment of the present disclosure, the second gate pattern may include the second gate electrode 141. The second gate electrode 141 may at least partially overlap the first gate electrode 131.

The first source electrode 181 may be in contact with the source connection electrode 132, and the first drain electrode 182 may be in contact with the drain connection electrode 133. In an exemplary embodiment of the present disclosure, a third contact hole CH3 exposing a portion of the source connection electrode 132 and a fourth contact hole CH4 exposing a portion of the drain connection electrode 133 may be formed in the second gate insulation layer 135, the first insulation interlayer 145, and the second insulation interlayer 165. The first source electrode 181 may fill the third contact hole CH3, and the first drain electrode 182 may fill the fourth contact hole CH4.

Hereinafter, a method of manufacturing the thin film transistor substrate in FIG. 16 will be described with reference to FIGS. 17 to 19.

FIGS. 17 to 19 are cross-sectional views illustrating a method of manufacturing the thin film transistor substrate in FIG. 16. In describing the arrangement shown in FIGS. 17 to 19, elements whose description has been omitted may be assumed to be at least similar to elements previously described with reference to FIGS. 5 to 15.

Referring to FIG. 17, the first contact hole CH1 exposing a portion of the first source region 122 of the first active pattern 120 and the second contact hole CH2 exposing a portion of the first drain region 123 of the first active pattern 120 may be formed. For example, the preliminary first gate insulation layer 125' may be selectively etched to form the first contact hole CH1 and the second contact hole CH2 passing through the preliminary first gate insulation layer 125'. A portion of an upper surface of the first source region 122 may be exposed by the first contact hole CH1, and a portion of an upper surface of the first drain region 123 may be exposed by the second contact hole CH2.

Referring to FIG. 18, a first conductive layer 130 filling the first contact hole CH1 and the second contact hole CH2 may be formed on the preliminary first gate insulation layer 125'. The first conductive layer 130 may be in contact with the upper surface of the first source region 122 exposed by the first contact hole CH1 and the upper surface of the first drain region 123 exposed by the second contact hole CH2.

Referring to FIG. 19, the first conductive layer 130 may be selectively etched to form the first gate pattern including the first gate electrode 131, the source connection electrode 132, the drain connection electrode 133, and the conductive layers 134a and 134b. The first gate electrode 131 may be formed over the first active pattern 120, the source connection electrode 132 and the drain connection electrode 133 which are in contact with the first source region 122 and the first drain region 123 of the first active pattern 120, respectively, may be formed, and the conductive layers 134a and 134b may be formed at an end of the first area DA and an end of the second area PA, respectively.

Hereinafter, a cross-sectional structure of a display device according to an exemplary embodiment of the present disclosure will be described with reference to FIG. 20.

FIG. 20 is a cross-sectional view illustrating a display device according to an exemplary embodiment of the present disclosure. FIG. 20 illustrates that the display device includes the thin film transistor substrate according to an exemplary embodiment of the present disclosure with reference to FIG. 4. However, the present invention is not limited thereto. The display device may include the thin film transistor substrate according to an exemplary embodiment of the present disclosure with reference to FIG. 16 or some other arrangement.

Referring to FIG. 20, the display device, according to an exemplary embodiment of the present disclosure, may include a thin film transistor substrate including a first active pattern 120, a first gate insulation layer 125, a first gate electrode 131, a second gate insulation layer 135, a second gate electrode 141, a source connection electrode 142, a drain connection electrode 143, a first insulation interlayer 145, a second active pattern 150, a third gate insulation layer 155, a third gate electrode 160, a second insulation interlayer 165, a first source electrode 181, a first drain electrode 182, a second source electrode 183, and a second drain electrode 184 provided on a base substrate 110, a first planarization layer 220, a second planarization layer 240, and a light emitting structure LE. The thin film transistor substrate may be assumed to be at least similar to the thin film transistor substrate described above with reference to FIGS. 4 and 16.

A protective layer 210 covering the first source-drain pattern may be disposed on the second insulation interlayer 165. In an exemplary embodiment of the present disclosure, the protective layer 210 may be disposed on the second insulation interlayer 165 along a profile of the first source-drain pattern with a uniform thickness and may cover the first source-drain pattern. The protective layer 210 may include silicon oxide, silicon nitride, silicon oxynitride, etc.

A first planarization layer 220 may be disposed on the protective layer 210. In an exemplary embodiment of the present disclosure, the first planarization layer 220 may at least partially cover the protective layer 210, and may have a substantially flat upper surface. An opening may be formed in the protective layer 210 within the bending area BA, and the first planarization layer 220 may fill the opening. The first planarization layer 220 may include an organic material such as photoresist, polyacrylate based resin, polyimide based resin, polyamide based resin, siloxane based resin, acryl based resin, epoxy base resin, or the like.

A second source-drain pattern may be disposed on the first planarization layer 220. In an exemplary embodiment of the present disclosure, the second source-drain pattern may include a pixel connection electrode 231 and a second wiring 232. The pixel connection electrode 231 may be in contact with the first drain electrode 182. In an exemplary embodiment of the present disclosure, a contact hole exposing a portion of the first drain electrode 182 may be formed in the protective layer 210 and the first planarization layer 220, and the pixel connection electrode 231 may fill the contact hole. The second wiring 232 may be in contact with the first wiring 185, and may extend from first area DA to the second area PA through the bending area BA. In an exemplary embodiment of the present disclosure, contact holes exposing opposite ends of the first wiring 185, respectively, may be formed in the protective layer 210 and the first planarization layer 220, and the second wiring 232 may be connected to the first wiring 185 and may fill the contact holes.

A second planarization layer 240 covering the second source-drain pattern may be disposed on the first planarization layer 220. In an exemplary embodiment of the present disclosure, the second planarization layer 240 may at least partially cover the second source-drain pattern, and may have a substantially flat upper surface without generating a stepped region around the second source-drain pattern. The second planarization layer 240 may include an organic material such as photoresist, polyacrylate based resin, polyimide based resin, polyamide based resin, siloxane based resin, acryl based resin, epoxy base resin, or the like.

A first electrode 250 may be disposed on the second planarization layer 240 in the first area DA. The first electrode 250 may be in contact with the pixel connection electrode 231 through a contact hole formed by removing a portion of the second planarization layer 240, and the first electrode 250 may be electrically connected the driving thin film transistor TR1. The first electrode 250 may include a metal, an alloy thereof, a nitride thereof, a conductive metal oxide, a transparent conductive material, etc.

A pixel defining layer 260 covering the first electrode 250 may be disposed on the second planarization layer 240. The pixel defining layer 260 may expose a portion of the first electrode 250. For example, the pixel defining layer 260 may cover an edge of the first electrode 250, and may include an opening exposing a center portion of the first electrode 250. The pixel defining layer 260 may include an organic material such as photoresist, polyacrylate based resin, polyimide based resin, polyamide based resin, siloxane based resin, acryl based resin, epoxy base resin, or the like.

An organic light emitting layer 270 may be disposed on a portion of the first electrode 250 exposed by the opening of the pixel defining layer 260. The organic light emitting layer 270 may be formed of various light emitting materials that emit different colors (e.g., red, green, blue, etc.) of light according to pixels. Alternatively, the organic light emitting layer 270 may emit white light by layering a plurality of light emitting materials that emit different colors (e.g., red, green, blue, etc.) of light. In this case, a color filter may be disposed over the organic light emitting layer 270. The color filter may include a red color filter, a green color filter, and/or a blue color filter.

A second electrode 280 may be disposed on the pixel defining layer 260 and the organic light emitting layer 270. The second electrode 280 may include a metal, an alloy thereof, a nitride thereof, a conductive metal oxide, a transparent conductive material, etc. Accordingly, the light emitting structure LE including the first electrode 250, the organic light emitting layer 270, and the second electrode 280 may be disposed on the second planarization layer 240 in the first area DA.

The display device, according to exemplary embodiments of the present invention, may be applied to a display device included in a computer, a notebook, a mobile phone, a smartphone, a smart pad, a PMP, a PDA, an MP3 player, or the like.

Although the thin film transistor substrates, methods of manufacturing thin film transistor substrates, and the display devices including thin film transistor substrates according to various exemplary embodiments of the present invention have been described herein with reference to the drawings, the illustrated embodiments are examples, and may be modified and changed in various ways without departing from the technical spirit of the present disclosure.

What is claimed is:

1. A thin film transistor (TFT) substrate, comprising:
a base substrate;
a first active pattern disposed on the base substrate;
a first gate insulation layer at least partially covering the first active pattern;
a first gate electrode disposed on the first gate insulation layer, the first gate electrode forming a first thin film transistor with the first active pattern;
a second gate insulation layer at least partially covering the first gate electrode;
a second gate electrode disposed on the second gate insulation layer, the second gate electrode at least partially overlapping the first gate electrode;
a source connection electrode contacting a source region of the first active pattern;
a drain connection electrode contacting a drain region of the first active pattern;
a first insulation interlayer at least partially covering the second gate electrode;
a second active pattern disposed on the first insulation interlayer;
a third gate insulation layer at least partially covering the second active pattern;
a third gate electrode disposed on the third gate insulation layer, the third gate electrode forming a second thin film transistor with the second active pattern;
a second insulation interlayer at least partially covering the third gate electrode; and
a first source electrode, a first drain electrode, a second source electrode, and a second drain electrode each disposed on the second insulation interlayer, the first source electrode and the first drain electrode contacting the source connection electrode and the drain connection electrode, respectively, and the second source electrode and the second drain electrode contacting a source region and a drain region of the second active pattern, respectively,
wherein the source connection electrode and the drain connection electrode each originate at the first active pattern and terminate at a level that is either between a level of the first gate electrode and a level of the second gate electrode or at the level of the first gate electrode.

2. The TFT substrate of claim 1, wherein the source connection electrode, the drain connection electrode, and the second gate electrode are all disposed within a common layer.

3. The TFT substrate of claim 1, wherein the source connection electrode, the drain connection electrode, and the first gate electrode are all disposed within a common layer.

4. The TFT substrate of claim 1, wherein: the source connection electrode is connected to the source region of the first active pattern through a first contact hole, and the drain connection electrode is connected to the drain region of the first active pattern through a second contact hole.

5. The TFT substrate of claim 4, wherein: the first source electrode is connected to the source connection electrode through a third contact hole, and the first drain electrode is connected to the drain connection electrode through a fourth contact hole.

6. The TFT substrate of claim 5, wherein a smallest width of the first contact hole and a smallest width of the second contact hole are greater than a largest width of the third contact hole and a largest width of the fourth contact hole, respectively.

7. The TFT substrate of claim 1, wherein: one of the first active pattern and the second active pattern includes a polycrystalline silicon semiconductor, and the other of the first active pattern and the second active pattern includes an oxide semiconductor.

8. A display device, comprising:
a base substrate;
a first active pattern disposed on the base substrate;
a first gate insulation layer at least partially covering the first active pattern;
a first gate electrode disposed on the first gate insulation layer, the first gate electrode forming a first thin film transistor with the first active pattern;
a second gate insulation layer at least partially covering the first gate electrode;
a second gate electrode disposed on the second gate insulation layer, the second gate electrode at least partially overlapping the first gate electrode;
a source connection electrode contacting a source region of the first active pattern;
a drain connection electrode contacting a drain region of the first active pattern;
a first insulation interlayer at least partially covering the second gate electrode;
a second active pattern disposed on the first insulation interlayer;
a third gate insulation layer at least partially covering the second active pattern;
a third gate electrode disposed on the third gate insulation layer, the third gate electrode forming a second thin film transistor with the second active pattern;
a second insulation interlayer at least partially covering the third gate electrode;
a first source-drain pattern disposed on the second insulation interlayer, the first source-drain pattern including a first source electrode and a first drain electrode contacting the source connection electrode and the drain connection electrode, respectively, and a second source electrode and a second drain electrode contacting a source region and a drain region of the second active pattern, respectively;
a first planarization layer at least partially covering the first source-drain pattern; and
a light emitting structure disposed on the first planarization layer, the light emitting structure being electrically connected to the first thin film transistor,
wherein the source connection electrode and the drain connection electrode each originate at the first active pattern and terminate at a level that is either between a level of the first gate electrode and a level of the second gate electrode or at the level of the first gate electrode.

9. The display device of claim 8, wherein the source connection electrode, the drain connection electrode, and the second gate electrode are all disposed within a common layer.

10. The display device of claim 8, wherein the source connection electrode, the drain connection electrode, and the first gate electrode are all disposed within a common layer.

11. The display device of claim 8, wherein: one of the first active pattern and the second active pattern includes a polycrystalline silicon semiconductor, and the other of the first active pattern and the second active pattern includes an oxide semiconductor.

12. The display device of claim 8, wherein the light emitting structure includes:
a first electrode disposed on the first planarization layer, the first electrode being electrically connected to the first drain electrode;

an organic light emitting layer disposed on the first electrode; and a second electrode disposed on the organic light emitting layer.

13. The display device of claim 12, wherein the base substrate includes:

a first area;

a second area spaced apart from the first area; and a bending area between the first area and the second area, wherein the first thin film transistor is disposed on the first area, wherein the second thin film transistor is disposed on the first area, wherein a capacitor is disposed on the first area, the capacitor including the first gate electrode and the second gate electrode, and wherein the light emitting structure is disposed on the first area.

14. The display device of claim 13, further comprising an organic layer disposed on the base substrate within the bending area, wherein the first source-drain pattern further includes a first wiring disposed on the organic layer.

15. The display device of claim 14, further comprising:

a second planarization layer disposed between the first planarization layer and the first electrode; and a second source-drain pattern disposed between the first planarization layer and the second planarization layer, the second source-drain pattern including a pixel connection electrode electrically connecting the first drain electrode to the first electrode and a second wiring within the bending area, the second wiring being electrically connected to the first wiring.

* * * * *